US009610730B2

(12) United States Patent
Engelbart

(10) Patent No.: US 9,610,730 B2
(45) Date of Patent: Apr. 4, 2017

(54) METHOD AND APPARATUS FOR REWORKING INCONSISTENCIES ON PARTS

(71) Applicant: The Boeing Company, Chicago, IL (US)

(72) Inventor: Roger W. Engelbart, St. Louis, MO (US)

(73) Assignee: THE BOEING COMPANY, Chicago, IL (US)

(*) Notice: Subject to any disclaimer, the term of this patent is extended or adjusted under 35 U.S.C. 154(b) by 0 days.

(21) Appl. No.: 14/736,048

(22) Filed: Jun. 10, 2015

(65) Prior Publication Data

US 2015/0273760 A1 Oct. 1, 2015

Related U.S. Application Data

(62) Division of application No. 13/480,984, filed on May 25, 2012, now Pat. No. 9,082,209.

(51) Int. Cl.
B32B 41/00 (2006.01)
B29C 65/00 (2006.01)
G06T 11/00 (2006.01)
B29C 73/06 (2006.01)
B29C 73/08 (2006.01)
(Continued)

(52) U.S. Cl.
CPC .............. B29C 66/90 (2013.01); B29C 73/06 (2013.01); B29C 73/08 (2013.01); B29C 73/26 (2013.01); G06F 17/50 (2013.01); G06T 11/00 (2013.01); B29C 2073/264 (2013.01); B29L 2031/3076 (2013.01)

(58) Field of Classification Search
CPC ......... B29C 66/90; B29C 73/08; B29C 73/26; B29C 73/06; B29C 2073/264; G06F 17/50; G06T 11/00; B29L 2031/3076
USPC ... 156/64, 98, 350, 351, 353, 360, 367, 378, 156/379
See application file for complete search history.

(56) References Cited

U.S. PATENT DOCUMENTS 6,174,392 B1 * 1/2001 Reis ........................ B29C 73/06
156/58
7,236,625 B2 6/2007 Engelbart et al.
(Continued)

OTHER PUBLICATIONS

Engelbart, "Method and Apparatus for Reworking Inconsistencies on Parts," U.S. Appl. No. 13/480,984, filed May 25, 2012, 74 pages.
(Continued)

Primary Examiner — John Goff
Assistant Examiner — Joshel Rivera
(74) Attorney, Agent, or Firm — Yee & Associates, P.C.

(57) ABSTRACT

A method and apparatus for reworking an inconsistency on a part. Information about the inconsistency on the part may be identified using data generated by a nondestructive evaluation system. A portion of a section of the part in which the inconsistency is located may be removed based on the information about the inconsistency. A profile for the section of the part may be identified. Rework image data may be generated using the profile in which the rework image data comprises a number of patch images. The number of patch images may be projected onto a rework material as a number of patch projections for use in forming a patch to be applied over the section of the part.

20 Claims, 15 Drawing Sheets

(51) Int. Cl.
*B29C 73/26* (2006.01)
*G06F 17/50* (2006.01)
*B29L 31/30* (2006.01)

(56) References Cited

U.S. PATENT DOCUMENTS

| | | |
|---|---|---|
| 7,489,392 B2 | 2/2009 | Engelbart et al. |
| 7,508,971 B2 | 3/2009 | Vaccaro et al. |
| 7,626,692 B2 | 12/2009 | Engelbart et al. |
| 7,668,616 B2 | 2/2010 | Piasse et al. |
| 8,094,921 B2 | 1/2012 | Engelbart et al. |
| 2005/0288890 A1 | 12/2005 | Hollingshead et al. |
| 2007/0034313 A1 | 2/2007 | Engelbart et al. |
| 2007/0127015 A1 | 6/2007 | Palmateer et al. |
| 2010/0161095 A1* | 6/2010 | Lindgren ............ G06F 17/5095 700/98 |
| 2010/0274545 A1 | 10/2010 | Greenberg et al. |
| 2010/0314029 A1* | 12/2010 | Lindgren ............... B23Q 17/20 156/98 |
| 2012/0093391 A1 | 4/2012 | Engelbart et al. |

OTHER PUBLICATIONS

Engelbart, "Method and System for Remote Rework Imaging for Part Inconsistencies," U.S. Appl. No. 13/868,724, filed Apr. 23, 2013, 70 pages.

Office Action, dated Feb. 5, 2015, regarding U.S. Appl. No. 13/480,984, 27 pages.

Notice of Allowance, dated Mar. 11, 2015, regarding U.S. Appl. No. 13/480,984, 13 pages.

* cited by examiner

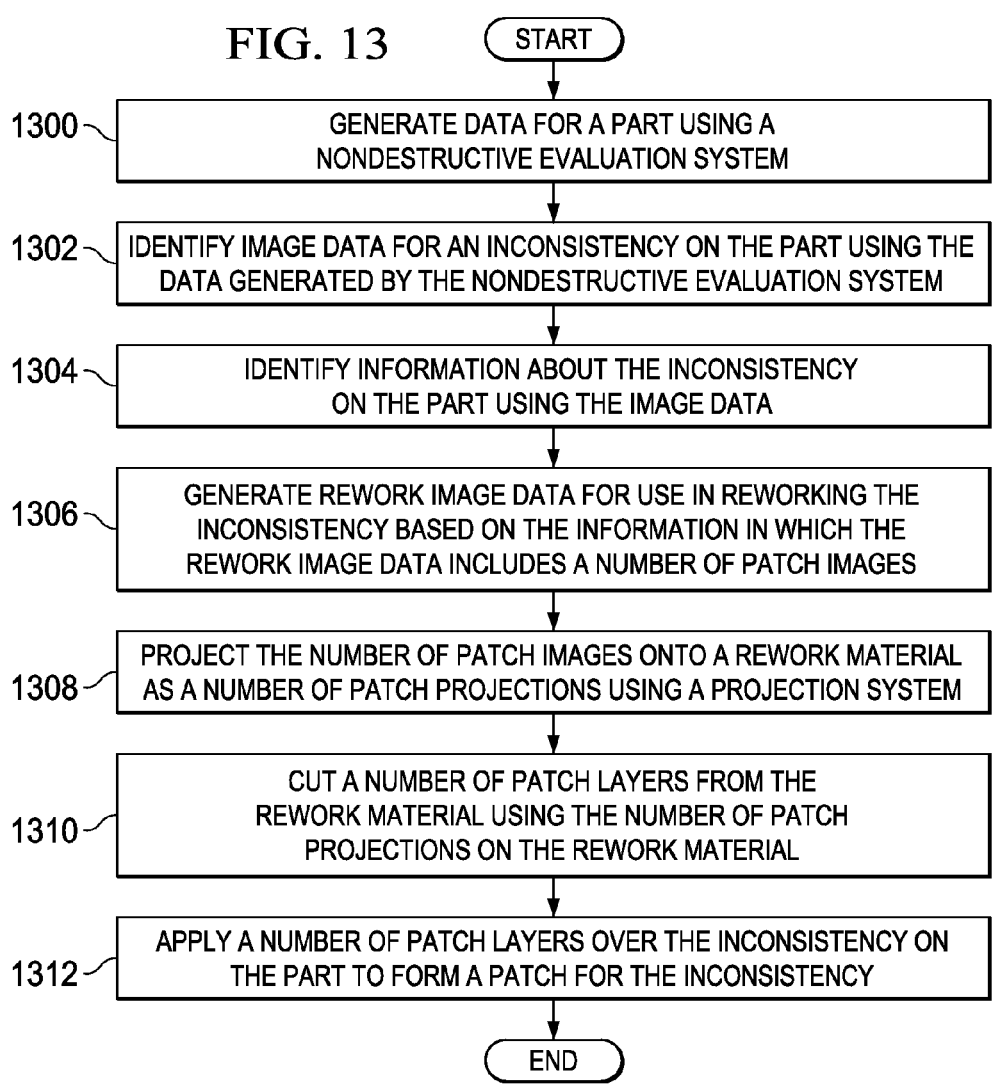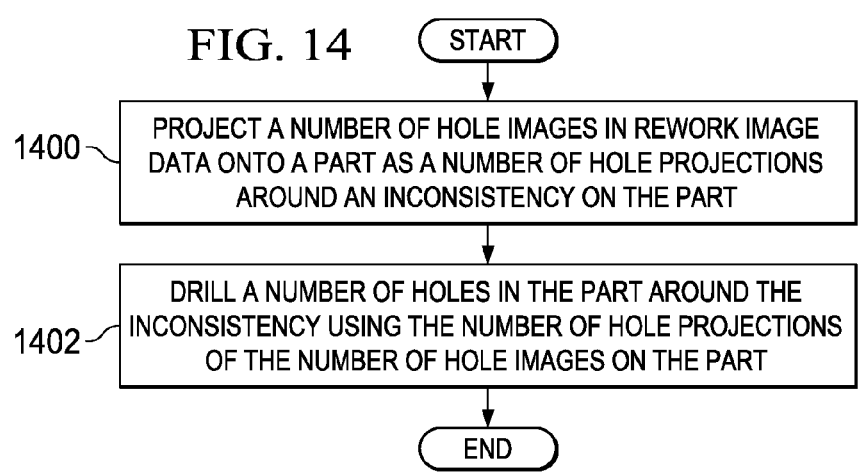

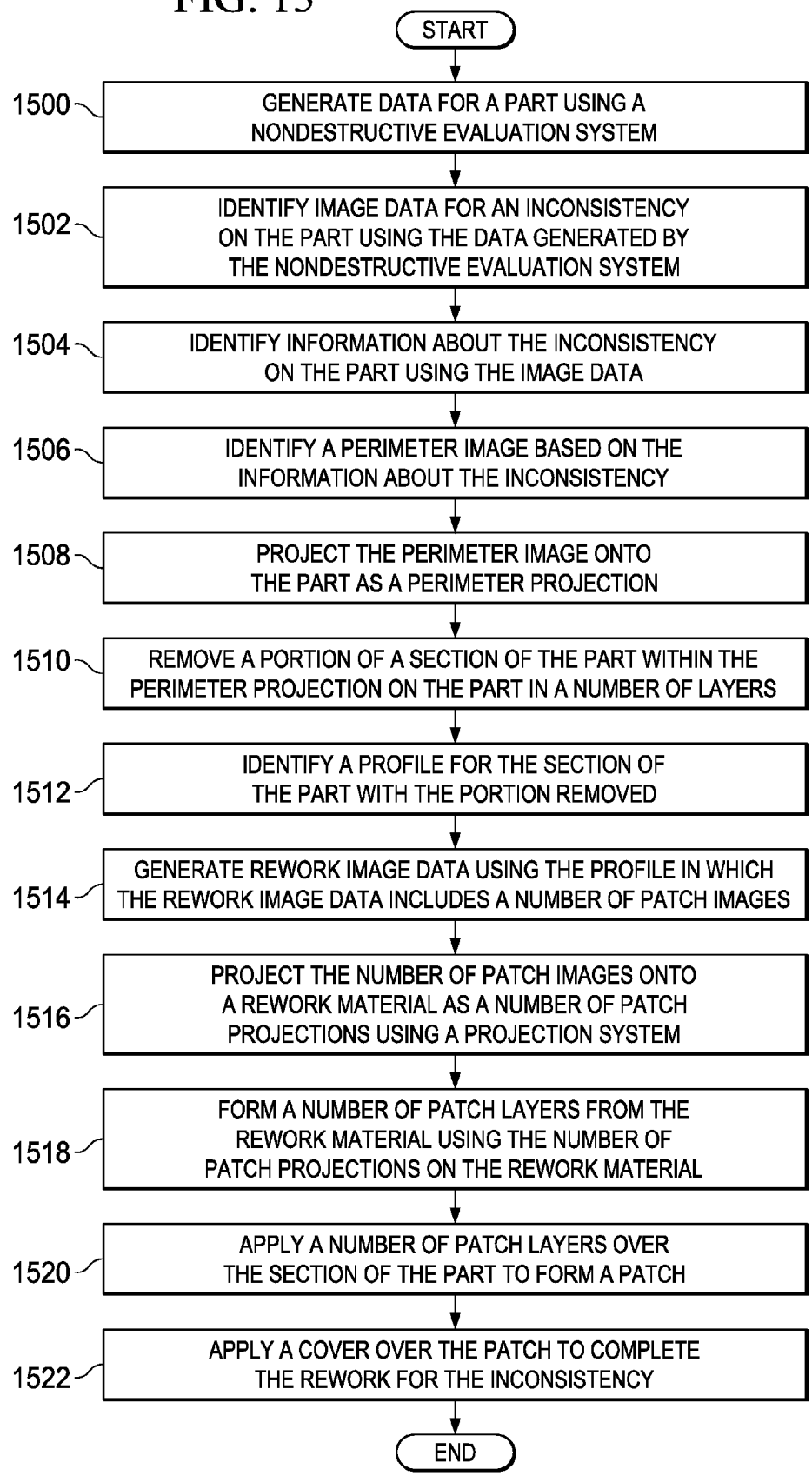

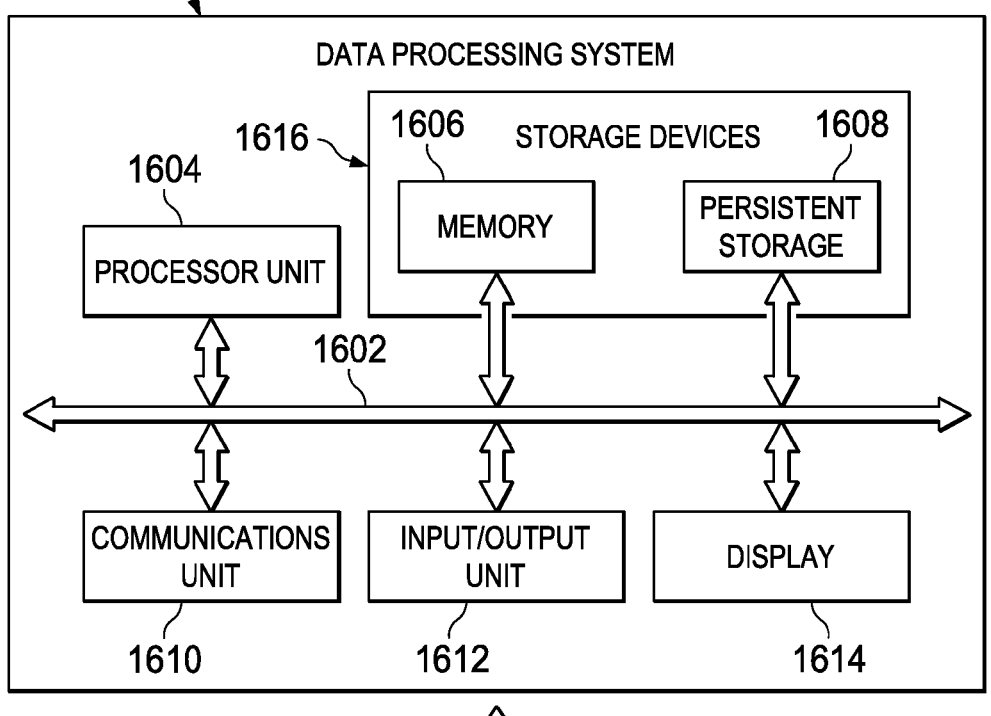
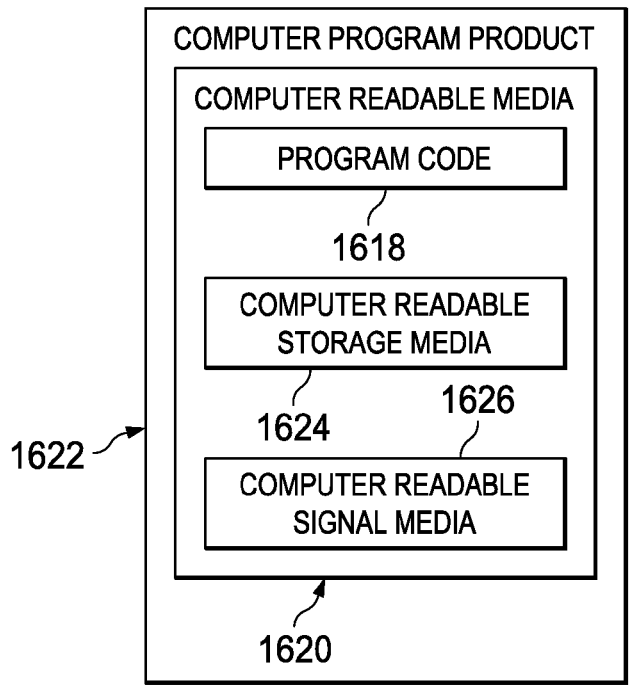
FIG. 16

METHOD AND APPARATUS FOR REWORKING INCONSISTENCIES ON PARTS

This application is a divisional of U.S. patent application Ser. No. 13/480,984, filed May 25, 2012.

BACKGROUND INFORMATION

1. Field

The present disclosure relates generally to reworking an inconsistency on a part and, in particular, to reworking an inconsistency on a part using a patch. Still more particularly, the present disclosure relates to a method and apparatus for forming a patch for an inconsistency using one or more patch images projected onto a rework material.

2. Background

An inconsistency may form on a part after a part has been manufactured. For example, an inconsistency may form on a part during fabrication, during assembly of the part, after the part has been in service, after operation of a platform on which the part is located, after maintenance, and/or after rework has been performed on the part. The inconsistency may be identified in a number of different ways.

For example, without limitation, the inconsistency may be identified using manual inspection of the part by a human operator, imaging techniques, nondestructive evaluation (NDE), and/or other suitable types of methods. Nondestructive evaluation also may be referred to as nondestructive inspection (NDI), nondestructive examination (NDE), or nondestructive testing (NDT).

Once an inconsistency has been identified, the inconsistency may typically be reworked. Reworking an inconsistency may include, for example, without limitation, filling in an inconsistency with a selected material, placing a patch over the inconsistency, or reworking the inconsistency in some other suitable manner.

With some currently available methods for reworking an inconsistency, sensor data generated using a nondestructive evaluation system may be used to print out a full-scale paper plot of the entire part or the area of the part in which the inconsistency is located. This paper plot may then be cut to trace an outline of the inconsistency on the part.

With other currently available methods, a transparent material may be overlaid on the paper plot such that the outline of the inconsistency can be traced on the transparent material. This outline may then be used to create a patch for the inconsistency. The transparent material may be, for example, without limitation, a plastic film, a Mylar sheet, a piece of transparent paper, or some other type of transparent material.

With one or more of these currently available methods, the time, effort, and/or cost needed to rework an inconsistency may be greater than desired. Further, with one or more of these currently available methods, reworking an inconsistency may be more difficult, more inefficient, and/or less accurate than desired.

Oftentimes, when reworking an inconsistency, one or more engineers may need to review the outline of the inconsistency to develop a plan to rework the inconsistency. These engineers may then need to explain the rework plan to one or more technicians. The technicians may use the outline of the inconsistency to rework the inconsistency based on the rework plan. For example, without limitation, the outline of the inconsistency may be used to form a multilayer patch for the inconsistency.

However, if the outline of the inconsistency is not properly aligned with the actual inconsistency of the part and/or the paper plot of the part is not properly aligned with the part, the patch may not meet a number of requirements for reworking the inconsistency correctly. Therefore, it would be desirable to have a method and apparatus that takes into account at least some of the issues discussed above, as well as other possible issues.

SUMMARY

In one illustrative embodiment, a method for reworking an inconsistency on a part may be present. Image data for the inconsistency on the part may be identified using data for the part generated by a nondestructive evaluation system. Information about the inconsistency may be identified using the image data. Rework image data may be generated using the information identified about the inconsistency. The rework image data may comprise a number of patch images. The number of patch images may be projected onto a rework material as a number of patch projections for use in forming a patch for the inconsistency.

In another illustrative embodiment, a method for reworking an inconsistency on a part may be present. Data for the part may be generated using a nondestructive evaluation system. The nondestructive evaluation system may be selected from one of an ultrasonic system, an eddy current testing system, an x-ray system, a magnetic resonance system, an interferometry system, an imaging system, a thermoelectric system, a thermographic system, and a microwave-based system. Image data for the inconsistency on the part may be identified using the data for the part generated by the nondestructive evaluation system. Information about the inconsistency may be identified using the image data. The information may comprise at least one of a size, a shape, a width, a length, a depth, a height, and a classification for the inconsistency. Rework image data may be generated using the information identified about the inconsistency. The rework image data may comprise a number of patch images. The number of patch images may be projected onto a rework material as a number of patch projections for use in forming a patch for the inconsistency. A number of patch layers may be formed from the rework material using the number of patch projections of the number of patch images on the rework material. The number of patch layers may be applied over the inconsistency to form the patch for the inconsistency.

In yet another illustrative embodiment, an apparatus may comprise a rework manager and a projection system. The rework manager may be configured to identify image data for an inconsistency on a part using data for the part generated by a nondestructive evaluation system. The rework manager may be further configured to identify information about the inconsistency using the image data. The rework manager may be configured to generate rework image data using the information identified about the inconsistency. The rework image data may comprise a number of patch images. The projection system may be configured to project the number of patch images onto a rework material as a number of patch projections for use in forming a patch for the inconsistency.

In yet another illustrative embodiment, a rework system may comprise a nondestructive evaluation system, a rework manager, a projection system, and a rework tool. The nondestructive evaluation system may be configured to generate data for a part. The nondestructive evaluation system may be selected from one of an ultrasonic system, an eddy current testing system, an x-ray system, a magnetic resonance system, an interferometry system, an imaging system, a thermoelectric system, a thermographic system, and a microwave-based system. The rework manager may be configured to receive the data for the part from the nondestructive evaluation system. The rework manager may be further configured to identify image data for an inconsistency on the part using the data for the part received from the nondestructive evaluation system. The rework manager may be further configured to identify information about the inconsistency using the image data. The information about the inconsistency may comprise at least one of a size, a shape, a width, a length, a depth, a height, and a classification for the inconsistency. The rework manager may be further configured to generate rework image data using the information identified about the inconsistency. The rework image data may comprise a number of patch images. The projection system may be configured to project the number of patch images onto a rework material as a number of patch projections for use in forming a patch for the inconsistency. The rework tool may be configured to form a number of patch layers from the rework material using the number of patch projections of the number of patch images on the rework material. The number of patch layers may be applied over the inconsistency to form the patch for the inconsistency.

In one illustrative embodiment, a method for reworking an inconsistency on a part may be provided. Information about the inconsistency on the part may be identified using data generated by a nondestructive evaluation system. A portion of a section of the part in which the inconsistency is located may be removed based on the information about the inconsistency. A profile for the section of the part may be identified. Rework image data may be generated using the profile in which the rework image data comprises a number of patch images. The number of patch images may be projected onto a rework material as a number of patch projections for use in forming a patch to be applied over the section of the part.

In another illustrative embodiment, a method for reworking an inconsistency on a part is provided. Data for the part may be generated using a nondestructive evaluation system. The nondestructive evaluation system may be selected from one of an ultrasonic system, an eddy current testing system, an x-ray system, a magnetic resonance system, an interferometry system, an imaging system, a thermoelectric system, a thermographic system, and a microwave-based system. Image data for the inconsistency on the part may be identified using the data for the part generated by the nondestructive evaluation system. Information about the inconsistency may be identified using the image data. The information may comprise at least one of a size, a shape, a width, a length, a depth, a height, and a classification for the inconsistency. A perimeter image for use in forming a scarf may be identified based on the information about the inconsistency. The perimeter image may be projected onto the part as a perimeter projection. A portion of the part within the perimeter projection on the part may be removed to form the scarf in a number of layers. A laser beam may be pointed across the scarf using a laser device. A profile for the scarf may be identified using the laser beam. Rework image data may be generated using the profile in which the rework image data comprises a number of patch images. The number of patch images may be projected onto a rework material as a number of patch projections for use in forming a patch. A number of patch layers may be formed from the rework material using the number of patch projections of the number of patch images on the rework material. The number of patch layers may be applied over the scarf to form the patch. A cover may be applied over the patch.

In yet another illustrative embodiment, an apparatus may comprise a rework manager and a projection system. The rework manager may be configured to identify information about an inconsistency on a part using data generated by a nondestructive evaluation system in which a portion of a section of the part in which the inconsistency is located is removed based on the information about the inconsistency. The rework manager may be configured to identify a profile for the section of the part. The rework manager may be configured to generate rework image data using the profile in which the rework image data comprises a number of patch images. The projection system may be configured to project the number of patch images onto a rework material as a number of patch projections for use in forming a patch to be applied over the scarf.

In still yet another illustrative embodiment, a rework system may comprise a nondestructive evaluation system, a rework manager, a projection system, a scarfing tool, a rework tool, and a cover. The nondestructive evaluation system may be configured to generate data for a part. The nondestructive evaluation system is selected from one of an ultrasonic system, an eddy current testing system, an x-ray system, a magnetic resonance system, an interferometry system, an imaging system, a thermoelectric system, a thermographic system, and a microwave-based system. The rework manager may be configured to identify information about an inconsistency on the part using the data generated by the nondestructive evaluation system. The information about the inconsistency comprises at least one of a size, a shape, a width, a length, a depth, a height, and a classification for the inconsistency. The rework manager may be configured to generate a perimeter image for use in forming a scarf in the part based on the information about the inconsistency and identify a profile for the scarf. The rework manager may be configured to generate rework image data using the profile in which the rework image data comprises a number of patch images. The projection system may be configured to project the perimeter image onto the part as a perimeter projection for use in forming the scarf and project the number of patch images onto a rework material as a number of patch projections for use in forming a patch to be applied over the scarf. The scarfing tool may be configured to remove a portion of the part within the perimeter projection to form the scarf in a number of layers. A rework tool may be configured to form a number of patch layers from the rework material using the number of patch projections of the number of patch images on the rework material in which the number of patch layers is applied over the scarf to form the patch. A cover may be configured to be applied over the patch.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 13 is an illustration of a process for reworking an inconsistency in the form of a flowchart in accordance with an illustrative embodiment;

FIG. 14 is an illustration of a process for preventing an inconsistency on a part from increasing in size in the form of a flowchart in accordance with an illustrative embodiment;

FIG. 15 is an illustration of a process for reworking an inconsistency in the form of a flowchart in accordance with an illustrative embodiment;

FIG. 16 is an illustration of a data processing system in accordance with an illustrative embodiment;

DETAILED DESCRIPTION

The different illustrative embodiments recognize and take into account different considerations. For example, the different illustrative embodiments recognize and take into account that reworking an inconsistency on a metal part may require using additional materials. The different illustrative embodiments also recognize and take into account that reworking, for example, without limitation, a crack in a metal part may require using a patch comprised of composite material. This patch may need to be formed remote to the location of the metal part prior to the patch being applied to the inconsistency.

The different illustrative embodiments recognize and take into account that some currently available methods for forming patches for inconsistencies may be more time-consuming, more expensive, and/or less efficient than desired. Further, some currently available methods for forming patches for inconsistencies may require a greater number of personnel and/or other resources than desired.

Thus, the different illustrative embodiments provide a method and apparatus for reworking an inconsistency on a part. In particular, the different illustrative embodiments provide a rework system that uses a number of patch images projected onto a rework material to form a patch for reworking an inconsistency. The number of patch images may be generated based on information identified about the inconsistency using data generated by a nondestructive evaluation system.

Figure 1A:
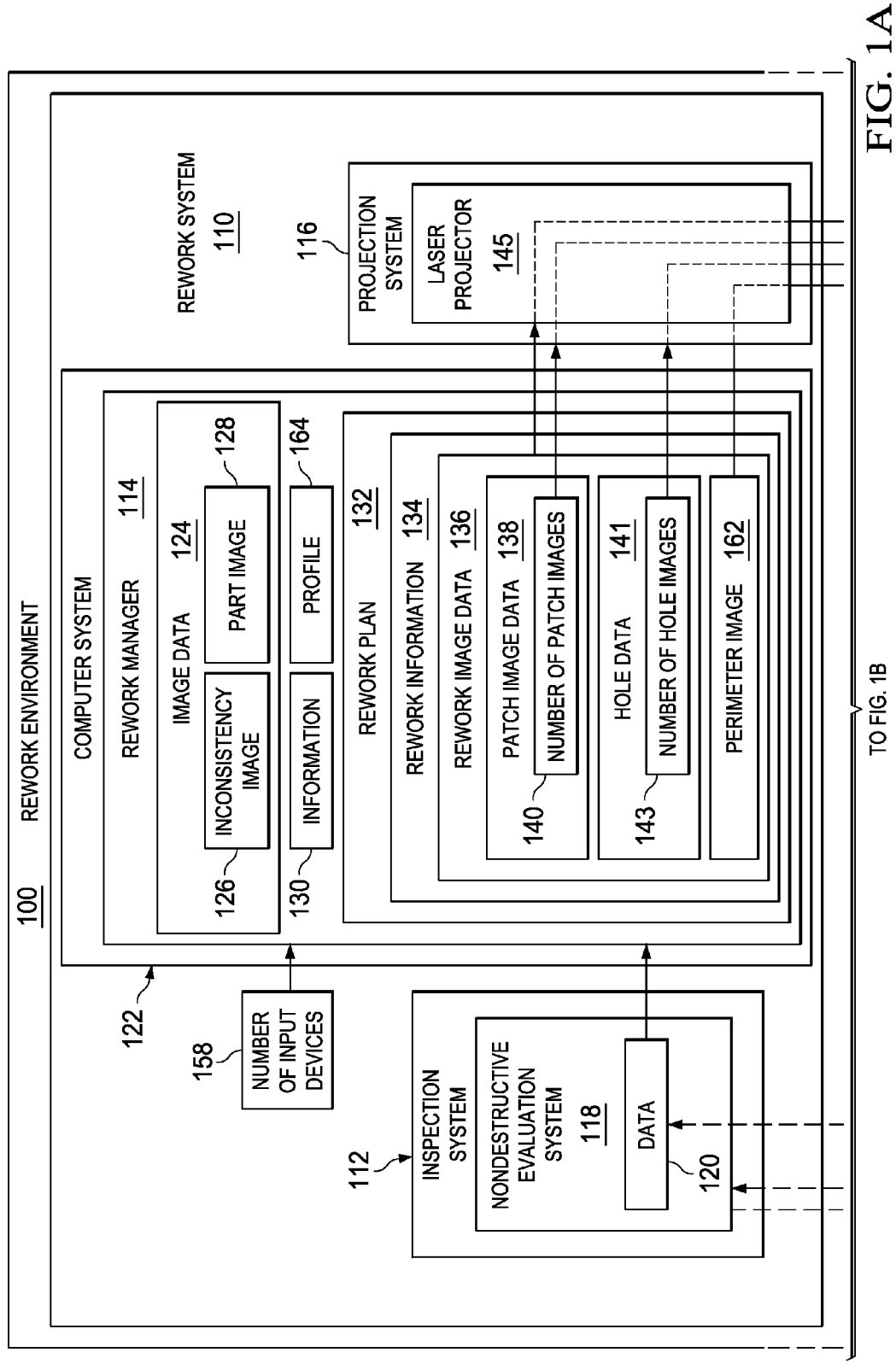
FIGS. 1A and 1B are an illustration of a rework environment in the form of a block diagram in accordance with an illustrative embodiment.
Figure 1B:
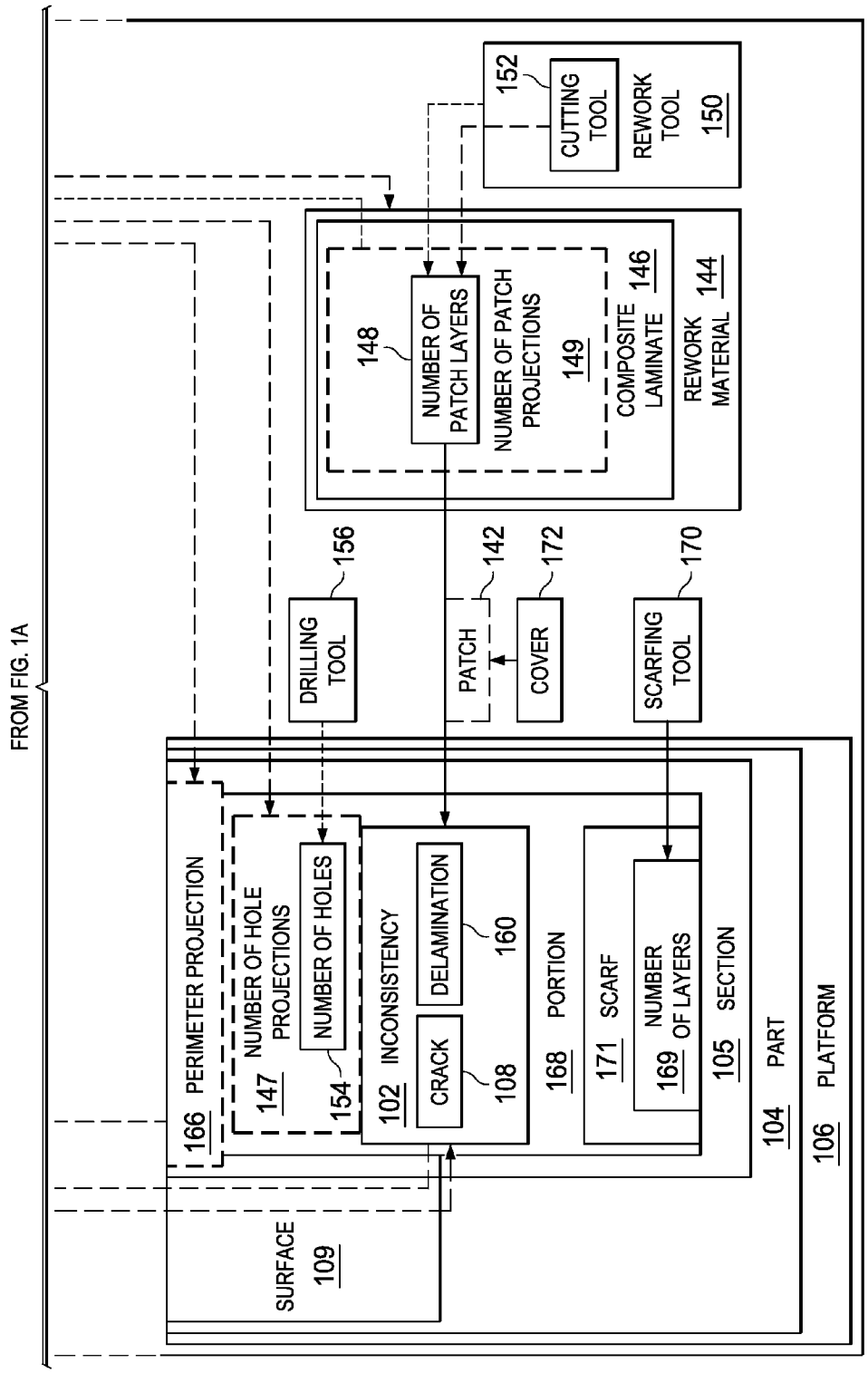

With reference now to FIGS. 1A and 1B, illustrations of a rework environment in the form of a block diagram are depicted in accordance with an illustrative embodiment. In this illustrative embodiment, rework environment 100 is an example of one environment in which inconsistency 102 on part 104 may be reworked in accordance with an illustrative embodiment. As depicted, inconsistency 102 may be located in section 105 of part 104.

Part 104 may be, for example, without limitation, a part or structure for platform 106. Platform 106 may be selected from one of a mobile platform and a stationary platform. A mobile platform may be, for example, without limitation, an aircraft, an unmanned aerial vehicle (UAV), a helicopter, a spacecraft, a train, a tank, an unmanned ground vehicle (UGV), an automobile, a ship, a submarine, or some other suitable type of platform that has the capability to move. A stationary platform may be, for example, without limitation, a land-based structure, an aquatic-based structure, a space-based structure, a space station, a satellite, a bridge, a building, a manmade structure, or some other suitable type of platform that remains stationary.

Part 104 may be comprised of any number of materials. In these illustrative examples, part 104 may be comprised of at least one of a metal, a metal alloy, a composite material, a plastic material, and some other suitable type of material.

As used herein, the phrase "at least one of", when used with a list of items, means different combinations of one or more of the listed items may be used and only one of each item in the list may be needed. For example, "at least one of item A, item B, and item C" may include, without limitation, item A or item A and item B. This example also may include item A, item B, and item C, or item B and item C. In other examples, "at least one of" may be, for example, without limitation, two of item A, one of item B, and ten of item C; four of item B and seven of item C; or some other suitable combination.

Inconsistency 102 on part 104 may take any number of different forms. For example, without limitation, inconsistency 102 may include at least one of a defect, a crack, a scratch, a hole, a delamination, and some other type of undesired feature on part 104. In these illustrative examples, inconsistency 102 may be crack 108. Further, inconsistency 102 on part 104 may be an inconsistency that is located on surface 109 of part 104 and/or or beneath surface 109 of part 104.

As depicted, rework system 110 may be used to rework inconsistency 102 on part 104. As used herein, "reworking" an inconsistency, such as inconsistency 102, may comprise at least one of applying a patch over the inconsistency, filling the inconsistency with a selected material, smoothing over the inconsistency, removing the inconsistency, and reworking the inconsistency in some other suitable manner.

In some cases, rework may only be needed for inconsistency 102 when inconsistency 102 is outside of selected tolerances. For example, in some cases, inconsistency 102 may have a size sufficiently small such that inconsistency 102 may not cause any undesired effects to part 104. In this situation, inconsistency 102 may not need to be reworked.

In these illustrative examples, rework system 110 may comprise inspection system 112, rework manager 114, and projection system 116. Inspection system 112 may be any system configured to inspect and/or evaluate part 104 without causing any undesired effects to part 104. For example, without limitation, inspection system 112 may comprise any number of sensors, transducers, cameras, and/or other suitable devices capable of inspecting part 104 without causing any undesired effects to part 104.

In one illustrative example, inspection system 112 may take the form of nondestructive evaluation system 118. Nondestructive evaluation system 118 may be selected from one of, for example, without limitation, an ultrasonic system, an eddy current testing system, an x-ray system, a magnetic resonance system, an interferometry system, an imaging system, a thermoelectric system, a thermographic system, a microwave-based system, or some other suitable type of nondestructive evaluation system. Nondestructive evaluation system 118 also may be referred to as a nondestructive testing (NDT) system, a nondestructive inspection (NDI) system, or a nondestructive examination (NDE) system.

Nondestructive evaluation system 118 may be used to inspect part 104 and generate data 120 for part 104. In some cases, data 120 may be used to identify inconsistency 102 on part 104. In other illustrative examples, nondestructive evaluation system 118 may be used to inspect inconsistency 102 that has already been identified and located on part 104. In these examples, data 120 generated by nondestructive evaluation system 118 may be for all of part 104 or for the portion of part 104 in which inconsistency 102 is located.

Rework manager 114 may be configured to receive and process data 120 generated by nondestructive evaluation system 118. Rework manager 114 may be implemented using hardware, software, or a combination of the two. For example, without limitation, rework manager 114 may be implemented in computer system 122 in these illustrative examples. Computer system 122 may comprise one or more computers. When computer system 122 includes more than one computer, these computers may be in communication with each other.

In some illustrative examples, computer system 122 may comprise one or more programmable devices. As used herein, a "programmable device" may be a personal computer, a laptop, a personal digital assistant (PDA), a smartphone, a tablet, or some other type of electronic device configured to receive and process data 120 from nondestructive evaluation system 118.

In these illustrative examples, rework manager 114 may receive data 120 from nondestructive evaluation system 118 using at least one of a wired communications link, a wireless communications link, an optical communications link, or some other suitable type of communications link. Of course, in other illustrative examples, data 120 may be transported to rework manager 114 using a portable storage device, a portable memory device, a flash drive, or some other suitable type of device configured to download data 120 from nondestructive evaluation system 118, allow data 120 to be transported to a different physical location, and upload data 120 to rework manager 114.

Rework manager 114 may be configured to identify image data 124 for inconsistency 102 of part 104 using data 120 received from nondestructive evaluation system 118. In these illustrative examples, image data 124 may include, for example, without limitation, inconsistency image 126, part image 128, and/or other types of image data.

Inconsistency image 126 may be an image of inconsistency 102. Part image 128 may be an image of the portion of part 104 on which inconsistency 102 is located. Depending on the implementation, part image 128 may be an image of a portion of part 104 or all of part 104. In one illustrative example, inconsistency image 126 may be part of part image 128. Inconsistency image 126 and part image 128 may be two-dimensional (2D) images or three-dimensional (3D) images, depending on the implementation.

In some illustrative examples, data 120 received from nondestructive evaluation system 118 may include image data 124. In other illustrative examples, rework manager 114 may be configured to process data 120 to identify image data 124.

Rework manager 114 may use image data 124 to identify information 130 about inconsistency 102 on part 104. Information 130 may include, for example, without limitation, at least one of a size, a shape, a width, a length, a depth, a height, a classification, and/or other suitable types of information about inconsistency 102. Rework manager 114 may use information 130 to generate rework plan 132 for use in reworking inconsistency 102 on part 104.

Rework plan 132 may be a plan for reworking inconsistency 102. In these illustrative examples, rework plan 132 may include rework information 134. Rework information 134 may include one or more steps, rules, requirements, and/or other pieces of information for use in reworking inconsistency 102 on part 104. For example, without limitation, rework information 134 may include rework image data 136. Rework image data 136 may comprise one or more images for use in reworking inconsistency 102.

In one illustrative example, rework image data 136 may comprise patch image data 138. Patch image data 138 may comprise number of patch images 140 for use in creating patch 142 for inconsistency 102. As used herein, a "number of" items means one or more items. In this manner, number of patch images 140 means one or more patch images. In this illustrative example, each patch image in number of patch images 140 may be used to form a different layer for patch 142. In other words, each patch image in number of patch images 140 may correspond to a particular patch layer for forming patch 142. In this manner, patch 142 may be a single layer patch or a multi-layer patch. Number of patch images 140 may be a number of two-dimensional (2D) images or a number of three-dimensional (3D) images.

In some illustrative examples, rework image data 136 also may include hole data 141. Hole data 141 may comprise number of hole images 143. Number of hole images 143 may be a number of two-dimensional images or a number of three-dimensional images. Number of hole images 143 may be for a number of holes to be formed in part 104 to prevent inconsistency 102 from increasing in size. For example, without limitation, when inconsistency 102 takes the form of crack 108, number of hole images 143 may be two hole images for two holes that are to be formed at the two ends of crack 108 to prevent crack 108 from expanding.

As depicted, projection system 116 may be configured to project rework image data 136 onto rework material 144.

Projection system 116 may take the form of, for example, without limitation, laser projector 145. Of course, in other illustrative examples, projection system 116 may comprise any number of devices configured to project a two-dimensional image and/or a three-dimensional image onto a surface.

Rework material 144 may be any material from which patch 142 for inconsistency 102 may be formed. In these illustrative examples, rework material 144 may be a composite material when part 104 is comprised of a metal, a metal alloy, a composite material, and/or some other type of material. For example, without limitation, rework material 144 may take the form of composite laminate 146. As used herein, a "composite laminate", such as composite laminate 146, may comprise a number of composite plies. Each composite ply in the composite laminate may be a different layer of composite material.

In these illustrative examples, each patch image in number of patch images 140 may be projected onto rework material 144 using projection system 116. In particular, number of patch images 140 may be projected onto rework material 144 as number of patch projections 149. Number of patch layers 148 may be formed from rework material 144 using rework tool 150 and number of patch projections 149 on rework material 144.

Rework tool 150 may take the form of, for example, without limitation, a cutting tool, a saw, a laser cutter, a router, or some other suitable type of tool configured to form a patch layer from rework material 144. In one illustrative example, number of patch layers 148 may be cut from rework material 144 at number of patch projections 149 on rework material 144 using rework tool 150 in the form of cutting tool 152. Rework tool 150 may be configured for use by a human operator, a robotic operator, or some other suitable type of operator.

Further, projection system 116 also may be configured to project number of hole images 143 onto part 104 as number of hole projections 147. Number of hole images 143 may be projected onto the portion of part 104 on which inconsistency 102 is located. Number of holes 154 may be formed in part 104 using number of holes projections 147. For example, drilling tool 156 may be used to form number of holes 154 in part 104 around inconsistency 102 at number of hole projections 147 on part 104.

Number of patch layers 148 may then be applied over inconsistency 102 to form patch 142 for inconsistency 102. Number of patch layers 148 may be applied over inconsistency 102 such that number of patch layers 148 may be centered with respect to each other. In some cases, number of patch layers 148 may be applied over inconsistency 102 such that one or more of number of patch layers 148 may be applied off-center relative to other patch layers in number of patch layers 148.

In some cases, number of patch layers 148 may be applied over inconsistency 102 in a "wedding cake" type configuration. With a "wedding cake" type configuration, the largest layer in number of patch layers 148 may be applied over inconsistency 102 in order of size with the largest layer in number of patch layers 148 being applied first over inconsistency 102 and the smallest layer in number of patch layers 148 being applied last over inconsistency 102.

In other illustrative examples, number of patch layers 148 may be applied over inconsistency 102 in an "inverse wedding cake" type configuration in which the smallest layer in number of patch layers 148 is applied first over inconsistency 102 and the largest layer in number of patch layers 148 is applied last over inconsistency 102.

In some illustrative examples, a portion of part 104 around inconsistency 102 may need to be prepped prior to patch 142 being applied over inconsistency 102. For example, in some cases, a portion of part 104 within section 105 of part 104 in which inconsistency 102 is located may need to be removed from part 104 prior to patch 142 being used to rework inconsistency 102. This type of process may be referred to as a scarf rework and may be performed when inconsistency 102 takes the form of delamination 160. Delamination 160 may occur when part 104 comprises multiple plies of composite material.

Rework manager 114 may generate perimeter image 162 using information 130 about inconsistency 102. Perimeter image 162 may be an outline that surrounds the entire inconsistency image 126. In this manner, perimeter image 162 may correspond to a perimeter that would encompass the entire inconsistency 102 on part 104.

Projection system 116 may be configured to project perimeter image 162 onto part 104 around inconsistency 102 as perimeter projection 166. Perimeter projection 166 may be used to identify a perimeter for removing portion 168 of section 105 of part 104. Portion 168 of section 105 of part 104 may be removed in a number of different ways. In one illustrative example, material may be removed from section 105 in the form of number of layers 169, with each of these layers having a different depth and/or size within section 105 of part 104. In other words, each layer may have a perimeter of a different length and/or depth.

Portion 168 may be removed from section 105 of part 104 using, for example, without limitation, at least one of a scarfing process, a step-lap process, and some other type of removal process. The step-lap process may be performed in such a manner that portion 168 of section 105 of part is removed in steps in which each step is configured to receive a ply of a selected thickness. Further, portion 168 of section 105 of part 104 may be removed from both sides of part 104 in some cases.

In other illustrative examples, the scarfing process may be used to remove portion 168 of section 105 of part 104 to form scarf 171. Scarf 171 may be formed using scarfing tool 170. Scarfing tool 170 may take the form of a cutting tool, a scraper, a laser tool, or some other type of scarfing tool. In some cases, rework tool 150 may be used to form scarf 171 instead of scarfing tool 170.

After portion 168 has been removed, section 105 of part 104 may be inspected to determine whether profile 164 of section 105 meets selected tolerances. For example, rework manager 114 may identify profile 164 for section 105 of part 104 having portion 168 removed. Profile 164 may be a profile of the contour or shape of section 105 after portion 168 has been removed. When scarf 171 is formed, profile 164 may be the profile of the contour or shape of scarf 171.

Profile 164 may be identified in a number of different ways. In one illustrative example, a laser device associated with inspection system 112 may be used to point a laser beam across scarf 171. Rework manager 114 may identify profile 164 using the laser beam. For example, rework manager 114 may identify profile 164 using an image of the laser beam generated by inspection system 112.

Rework manager 114 may use profile 164 to determine whether scarf 171 meets selected tolerances. If scarf 171 does not meet selected tolerances, then additional material may be removed from part 104 to reshape scarf 171.

When profile 164 meets selected tolerances, rework manager 114 may use profile 164 to generate number of patch images 140 for forming number of patch layers 148. Each patch image in number of patch images 140 may correspond to a particular layer in number of layers 169. In particular, each patch image in number of patch images 140 may be generated such that the patch layer formed corresponding to the patch image substantially conforms to the corresponding layer in number of layers 169.

In this manner, number of patch layers 148 may be formed such that number of patch layers 148 may be applied over section 105 to fill in section 105 where portion 168 was removed. For example, number of patch layers 148 may be applied over scarf 171 to fill in scarf 171. In particular, number of patch layers 148 may be applied over scarf 171 in the form of an "inverse wedding cake" type configuration, depending on scarf 171.

In some cases, cover 172 may be applied over patch 142. Cover 172 may extend over patch 142 and a portion of part 104 around patch 142. Cover 172 may be comprised of one or more plies of composite material, depending on the implementation.

In some illustrative examples, rework system 110 may include number of input devices 158. Number of input devices 158 may allow a human operator to interact with rework manager 114. For example, without limitation, number of input devices 158 may be used to edit at least one of image data 124 and rework image data 136.

Using rework manager 114 to generate rework information 134 and projection system 116 to project number of patch images 140 onto rework material 144 and number of hole images 143 onto part 104 may reduce the number of errors that may occur during reworking of inconsistency 102. Further, the amount of time and/or the number of personnel needed to rework inconsistency 102 may be reduced as compared to using some currently available methods for reworking an inconsistency.

The illustration of rework environment 100 in FIGS. 1A and 1B is not meant to imply physical or architectural limitations to the manner in which an illustrative embodiment may be implemented. Other components in addition to or in place of the ones illustrated may be used. Some components may be excluded. Also, the blocks are presented to illustrate some functional components. One or more of these blocks may be combined, divided, or combined and divided into different blocks when implemented in an illustrative embodiment.

In some illustrative examples, image data 124, information 130, and/or rework plan 132 may be identified by different modules separate from rework manager 114. In other illustrative examples, rework information 134 may include other types of images in addition to and/or in place of number of patch images 140 and/or number of hole images 143.

In some cases, projection system 116 may be used to project at least one of inconsistency image 126 and part image 128 onto part 104. In this manner, one or more rework operations may be performed on part 104 at the location of inconsistency 102 on part 104 using inconsistency image 126.

With reference now to FIGS. 2-6, illustrations of a process for reworking an inconsistency are depicted in accordance with an illustrative embodiment. The different components shown in FIGS. 2-6 may be combined with components in FIGS. 1A and 1B, used with components in FIGS. 1A and 1B, or a combination of the two. Additionally, some of the components in FIGS. 2-6 may be illustrative examples of how components shown in block form in FIGS. 1A and 1B can be implemented as physical structures.

Figure 2:
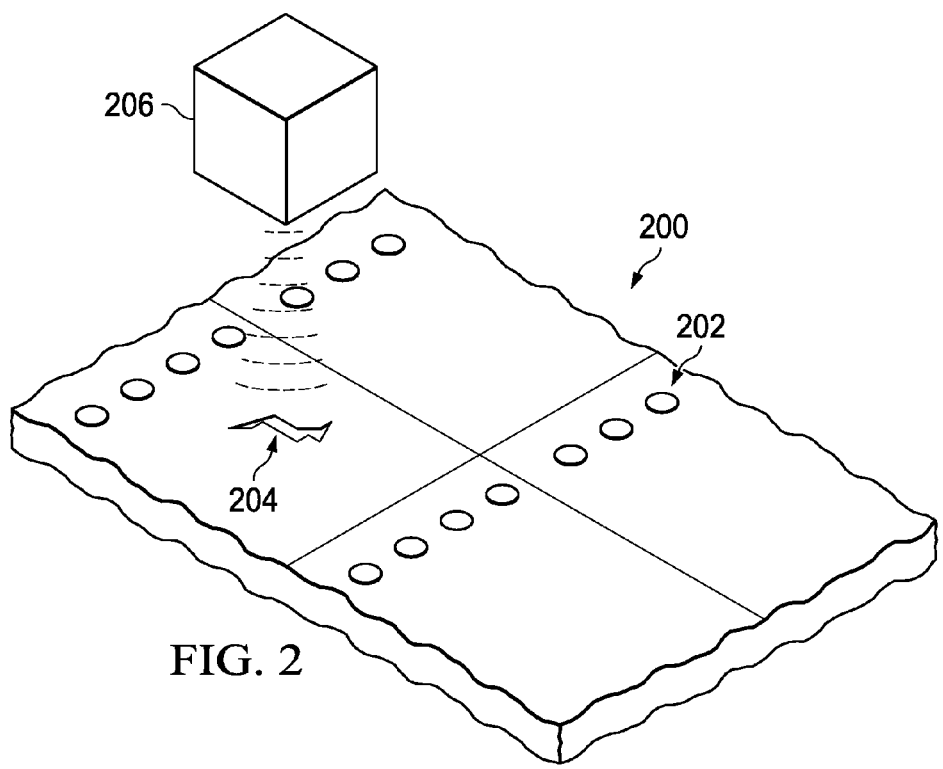
FIG. 2 is an illustration of a part being inspected by a nondestructive evaluation system in accordance with an illustrative embodiment.

Turning now to FIG. 2, an illustration of a part being inspected by a nondestructive evaluation system is depicted in accordance with an illustrative embodiment. In this illustrative example, part 200 may be an example of one implementation for part 104 in FIG. 1B. Part 200 may be, for example, without limitation, a skin panel for an aerospace vehicle.

In this illustrative example, part 200 may be comprised of one or more metals and/or metal alloys. Further, as depicted, fasteners 202 may be installed on part 200. Additionally, inconsistency 204 may be present on part 200. Inconsistency 204 may be, for example, without limitation, a crack in part 200.

Nondestructive evaluation system 206 may be used to inspect part 200. Nondestructive evaluation system 206 may be an example of one implementation for nondestructive evaluation system 118 in FIG. 1A. In this illustrative example, nondestructive evaluation system 206 may take the form of an ultrasonic inspection system. Nondestructive evaluation system 206 may be configured to generate data about inconsistency 204 on part 200. This data may include, for example, without limitation, one or more images (not shown) of inconsistency 204 on part 200.

Figure 3:
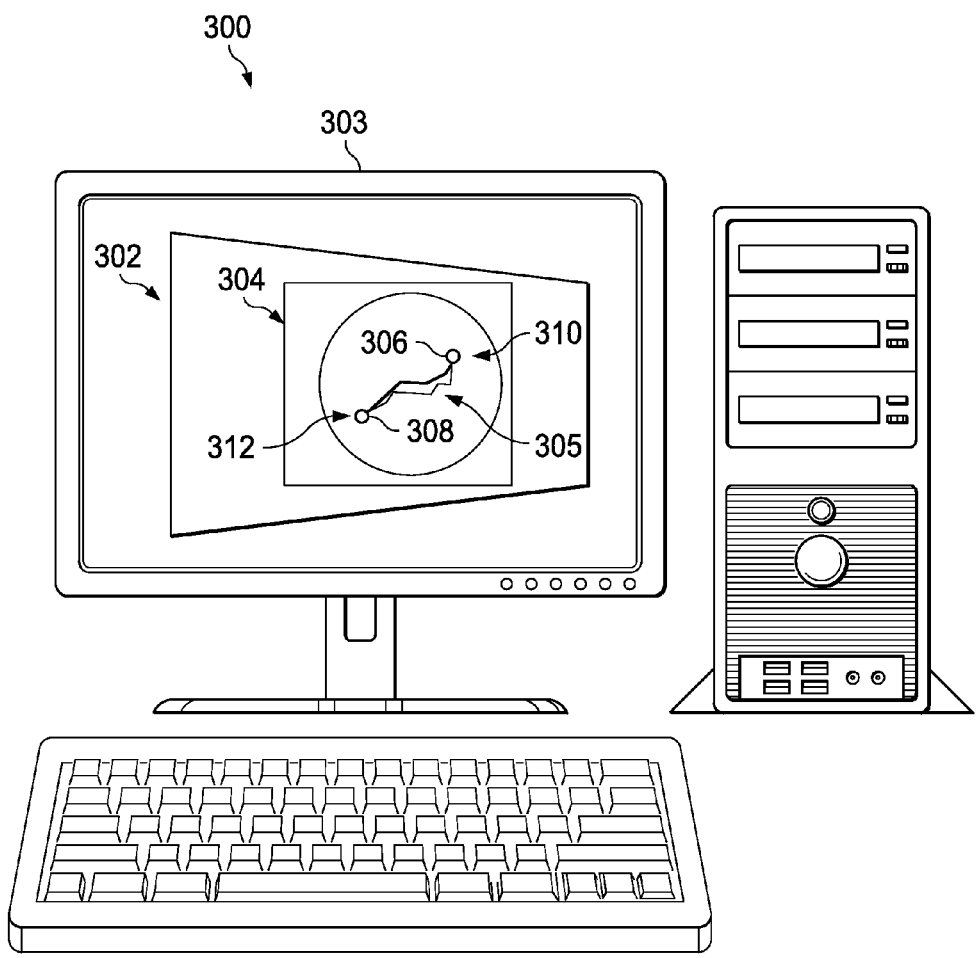
FIG. 3 is an illustration of a computer system displaying images for a part in accordance with an illustrative embodiment.

With reference now to FIG. 3, an illustration of a computer system displaying images for part 200 in FIG. 2 is depicted in accordance with an illustrative embodiment. In this illustrative example, computer system 300 may be an example of one implementation for computer system 122 in FIG. 1A. A rework manager (not shown), such as, for example, without limitation, rework manager 114 in FIG. 1A, may be implemented in computer system 300.

As depicted, part image 302 may be displayed on display system 303 in computer system 300. Part image 302 may be an image of part 200 in FIG. 2. Portion 304 of part image 302 may include inconsistency image 305. Inconsistency image 305 may be an image of inconsistency 204 on part 200 in FIG. 2.

In this illustrative example, the rework manager (not shown) may identify information about inconsistency 204 on part 200 in FIG. 2 using inconsistency image 305. The rework manager may then use this information to form and display hole image 306 and hole image 308 on part image 302 on display system 303. The formation of hole image 306 and hole image 308 may be considered part of the rework performed for inconsistency 204 on part 200 in FIG. 2.

Hole image 306 and hole image 308 may be examples of one implementation for number of hole images 143 in FIG. 1A. Hole image 306 may be displayed at end 310 of inconsistency image 305, and hole image 308 may be displayed at end 312 of inconsistency image 305 on computer system 300. Hole image 306 and hole image 308 may represent holes that may need to be formed around inconsistency 204 on part 200 in FIG. 2 to prevent inconsistency 204 from increasing in size.

Figure 4:
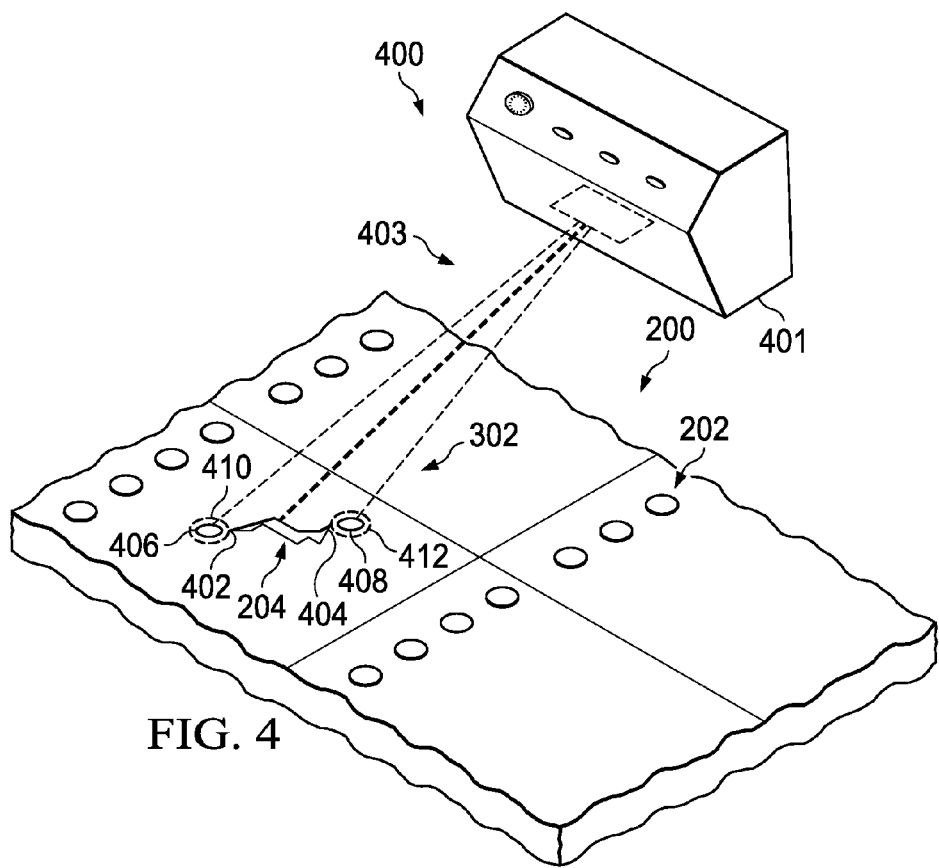
FIG. 4 is an illustration of a projection system projecting hole images onto a part in accordance with an illustrative embodiment.

Turning now to FIG. 4, an illustration of a projection system projecting hole image 306 and hole image 308 from FIG. 3 onto part 200 from FIG. 2 is depicted in accordance with an illustrative embodiment. In this illustrative example, projection system 400 may be an example of one implementation for projection system 116 in FIG. 1A. As depicted, projection system 400 may take the form of laser projector 401.

Laser projector 401 may be configured to project hole image 306 and hole image 308 from FIG. 3 onto part 200 around inconsistency 204 using laser beams 403. In particular, hole image 306 may be projected onto part 200 as hole projection 410 at end 402 of inconsistency 204. Hole image 308 may be projected onto part 200 as hole projection 412 at end 404 of inconsistency 204. This projection of hole projection 410 and hole projection 412 may be considered part of the rework for inconsistency 204.

A drilling tool (not shown), such as drilling tool 156 in FIG. 1B, may be used to form hole 406 at end 402 of inconsistency 204 at hole projection 410 on part 210 and hole 408 at end 404 of inconsistency 204 at hole projection 412 on part 200. Hole 406 and hole 408 may prevent inconsistency 204 from expanding along part 200. Hole 406 and hole 408 may be considered part of the rework for inconsistency 204.

Figure 5:
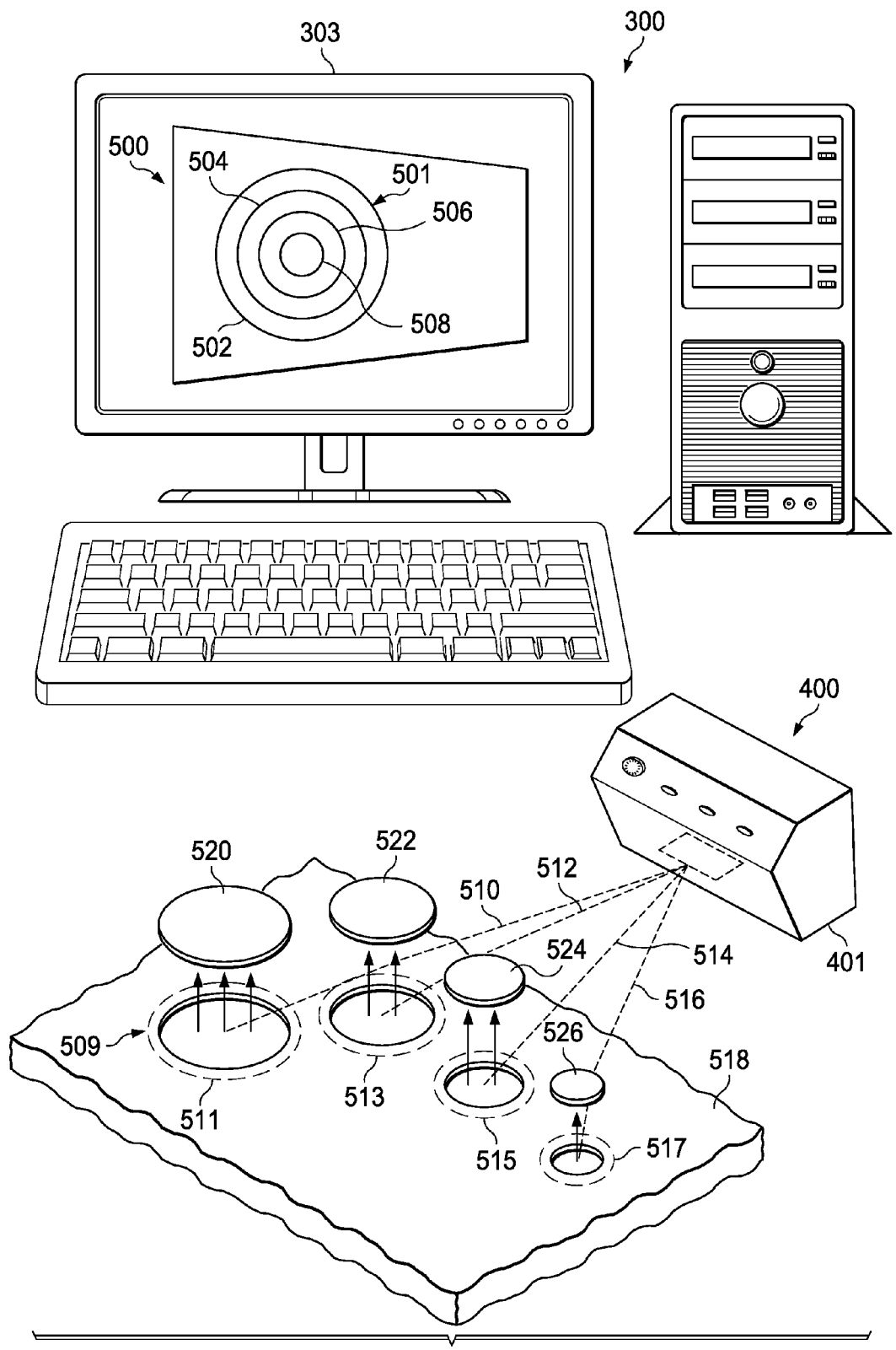
FIG. 5 is an illustration of a computer system displaying a rework plan for forming a patch for an inconsistency on a part in accordance with an illustrative embodiment.

Turning now to FIG. 5, an illustration of computer system 300 displaying a rework plan for forming a patch for inconsistency 204 on part 200 in FIGS. 2 and 4 is depicted in accordance with an illustrative embodiment. In this illustrative example, rework plan 500 may be displayed on display system 303 on computer system 300. Rework plan 500 may be an example of one implementation for rework plan 132 in FIG. 1A.

As depicted, rework plan 500 may include number of patch images 501. Number of patch images 501 may be an example of one implementation for number of patch images 140 in FIG. 1A. Number of patch images 501 may include patch images 502, 504, 506, and 508. These patch images are displayed overlapped over each other.

Projection system 400 may be configured to receive and project patch images 502, 504, 506, and 508 onto rework material 518 as number of patch projections 509 using laser beams 510, 512, 514, and 516, respectively. Number of patch projections 509 may include patch projections 511, 513, 515, and 517. A rework tool (not shown), such as, for example, without limitation, cutting tool 152 in FIG. 1B, may be used to cut patch layers 520, 522, 524, and 526 from rework material 518 using patch projections 511, 513, 515, and 517 on rework material 518.

Figure 6:
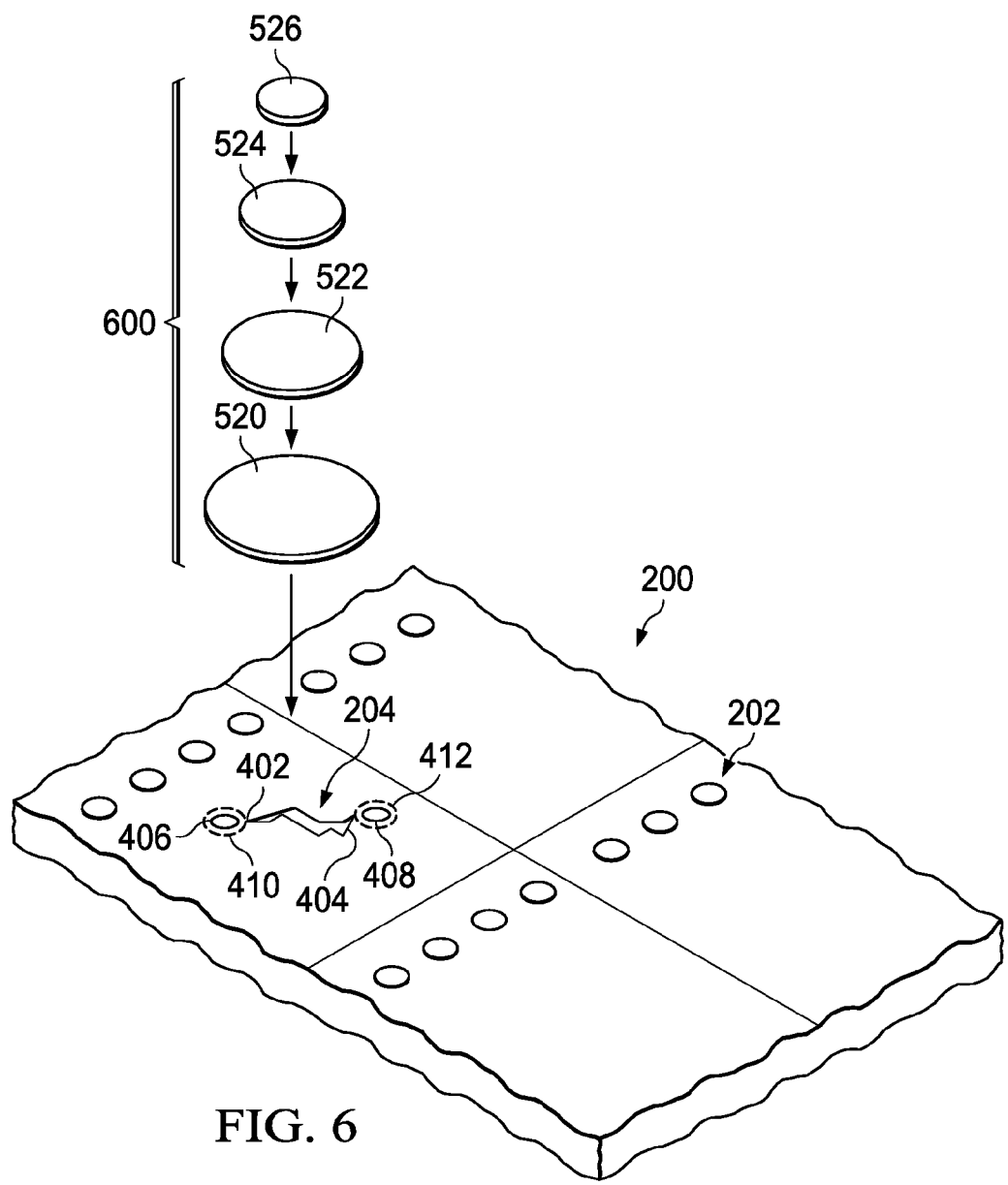
FIG. 6 is an illustration of a patch being applied to an inconsistency on a part in accordance with an illustrative embodiment.

With reference now to FIG. 6, an illustration of a patch being applied to inconsistency 204 on part 200 from FIG. 2 is depicted in accordance with an illustrative embodiment. In this illustrative example, patch layers 520, 522, 524, and 526 may be applied over inconsistency 204 to rework inconsistency 204. In particular, patch layers 520, 522, 524, and 526 may together form patch 600 for inconsistency 204.

As depicted, patch layers 520, 522, 524, and 526 may be applied over inconsistency 204 in a "wedding cake" type configuration. In particular, patch layers 520, 522, 524, and 526 may be stacked in a manner that resembles a multi-layered wedding cake. In other words, the different patch layers may be applied over inconsistency 204 in order of size. In particular, the largest patch layer, patch layer 520, may be applied first over inconsistency 204. The smallest patch layer, patch layer 526, may be applied last. Of course, in other illustrative examples, these different patch layers may be applied in an "inverse wedding cake" type configuration with the smallest patch layer being applied first and the largest patch layer being applied last.

With reference now to FIGS. 7-12, illustrations of a process for reworking an inconsistency are depicted in accordance with an illustrative embodiment. The different components shown in FIGS. 7-12 may be combined with components in FIGS. 1A and 1B, used with components in FIGS. 1A and 1B, or a combination of the two. Additionally, some of the components in FIGS. 7-12 may be illustrative examples of how components shown in block form in FIGS. 1A and 1B can be implemented as physical structures. In FIGS. 7-12, nondestructive evaluation system 206 from FIG. 2, computer system 300 from FIG. 3, and projection system 400 from FIG. 4 may be used to rework an inconsistency.

Figure 7:
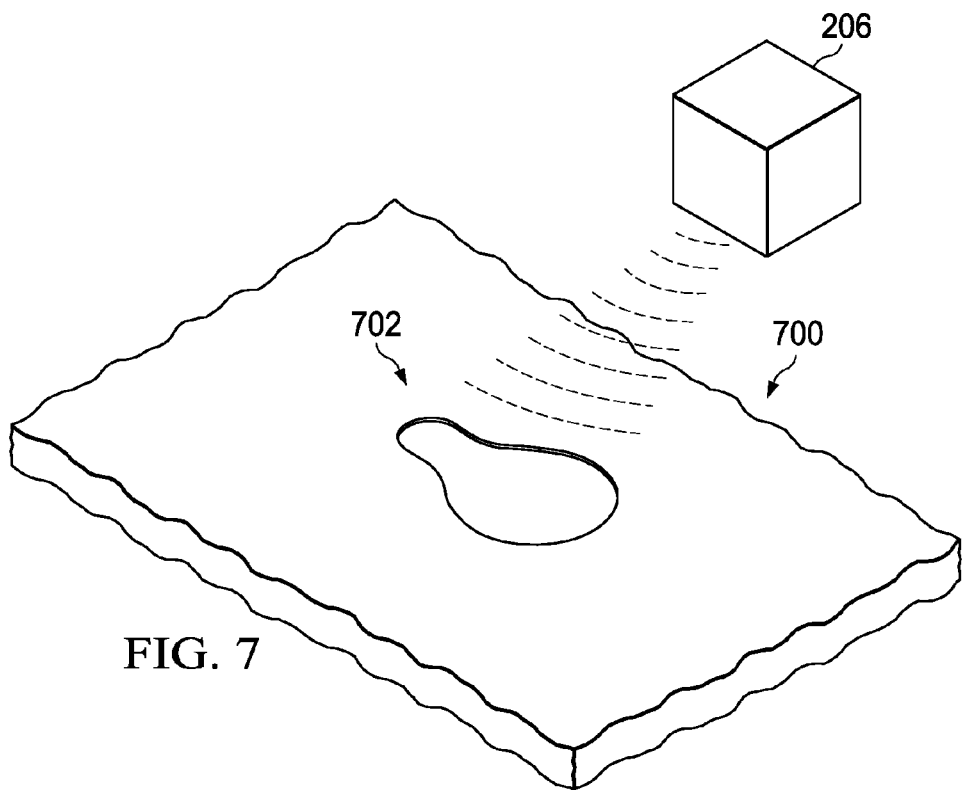
FIG. 7 is an illustration of a part being inspected by a nondestructive evaluation system in accordance with an illustrative embodiment.

Turning now to FIG. 7, an illustration of a part being inspected by nondestructive evaluation system 206 is depicted in accordance with an illustrative embodiment. In this illustrative example, part 700 may be an example of one implementation for part 104 in FIG. 1B. Part 700 may be, for example, without limitation, a skin panel for an aerospace vehicle.

In this illustrative example, part 200 may be comprised of a composite material. As depicted, inconsistency 702 may be present on part 700. Inconsistency 702 may be, for example, without limitation, a delamination of one or more plies of the composite material in part 700.

Nondestructive evaluation system 206 from FIG. 2 may be used to inspect part 700. Nondestructive evaluation system 206 may be used to generate data about inconsistency 702 on part 700. This data may include, for example, without limitation, one or more images (not shown) of inconsistency 702 on part 700.

Figure 8:
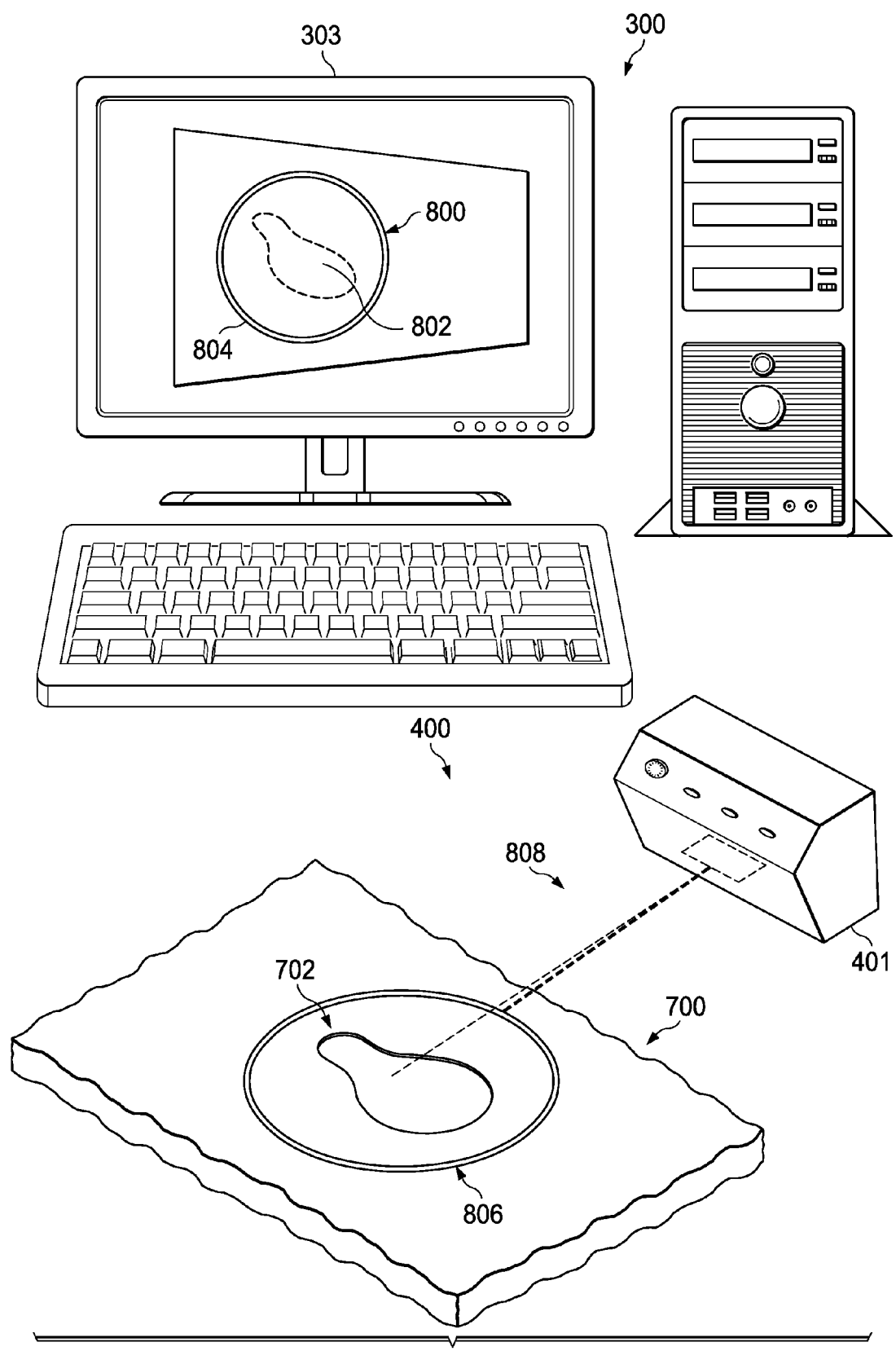
FIG. 8 is an illustration of a computer system displaying images for a part in accordance with an illustrative embodiment.

With reference now to FIG. 8, an illustration of computer system 300 displaying images for part 700 in FIG. 7 is depicted in accordance with an illustrative embodiment. In this illustrative example, a rework manager (not shown), such as, for example, without limitation, rework manager 114 in FIG. 1A, implemented in computer system 300, may display part image 800 on display system 303 in computer system 300 from FIG. 3.

Part image 800 may be an image of part 700 in FIG. 7. Part image 800 may include inconsistency image 802. Inconsistency image 802 may be an image of inconsistency 702 on part 700 in FIG. 7.

In this illustrative example, the rework manager (not shown) may identify information about inconsistency 702 on part 700 in FIG. 7 using inconsistency image 802. The rework manager may then use this information to form and display perimeter image 804 on display system 303. As depicted, perimeter image 804 may be an image of a perimeter around inconsistency image 802 that may correspond to a perimeter for performing a scarf rework for inconsistency 702 in FIG. 7. Perimeter image 804 may be an example of one implementation for perimeter image 162 in FIG. 1.

Projection system 400 from FIG. 4 may be configured to project perimeter image 804 onto part 700 as perimeter projection 806 using laser beams 808. Perimeter projection 806 may be used to remove material from part 700 to perform a scarf rework for inconsistency 702 in FIG. 7.

Figure 9:
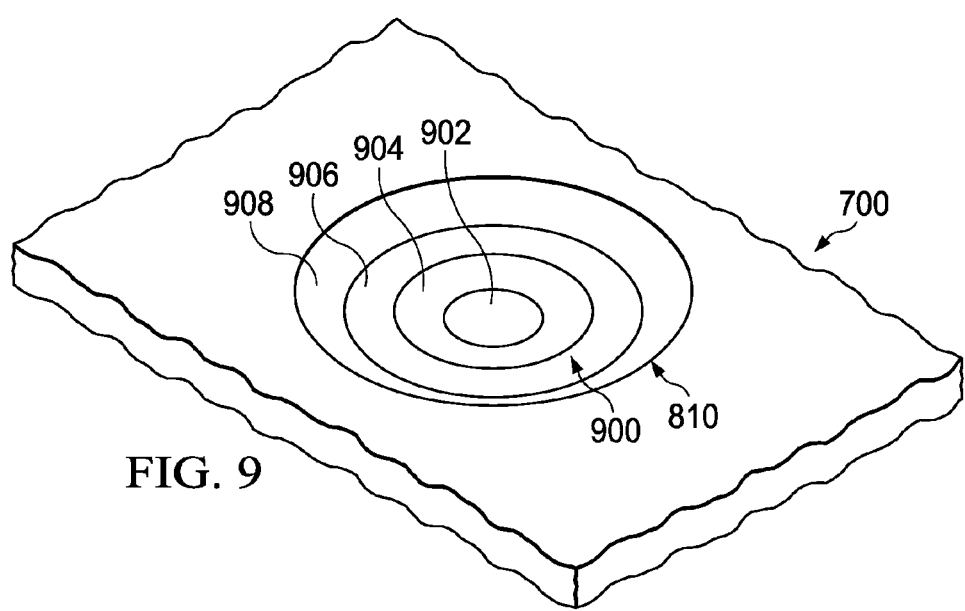
FIG. 9 is an illustration of a scarf in accordance with an illustrative embodiment.

Turning now to FIG. 9, an illustration of a scarf is depicted in accordance with an illustrative embodiment. In this illustrative example, composite material may be removed from part 700 to form scarf 900. In particular, composite material may be removed in a manner that forms scarf layers 902, 904, 906, and 908.

Scarf layer 902 may be the deepest scarf layer, while scarf layer 908 may be the shallowest scarf layer. Further, scarf layer 902 may have the smallest perimeter of scarf layers 902, 904, 906, and 908. Scarf layer 908 may have the widest perimeter of scarf layers 902, 904, 906, and 908. More specifically, scarf layer 908 may have a perimeter that is substantially equal to the perimeter of perimeter projection 806.

Figure 10:
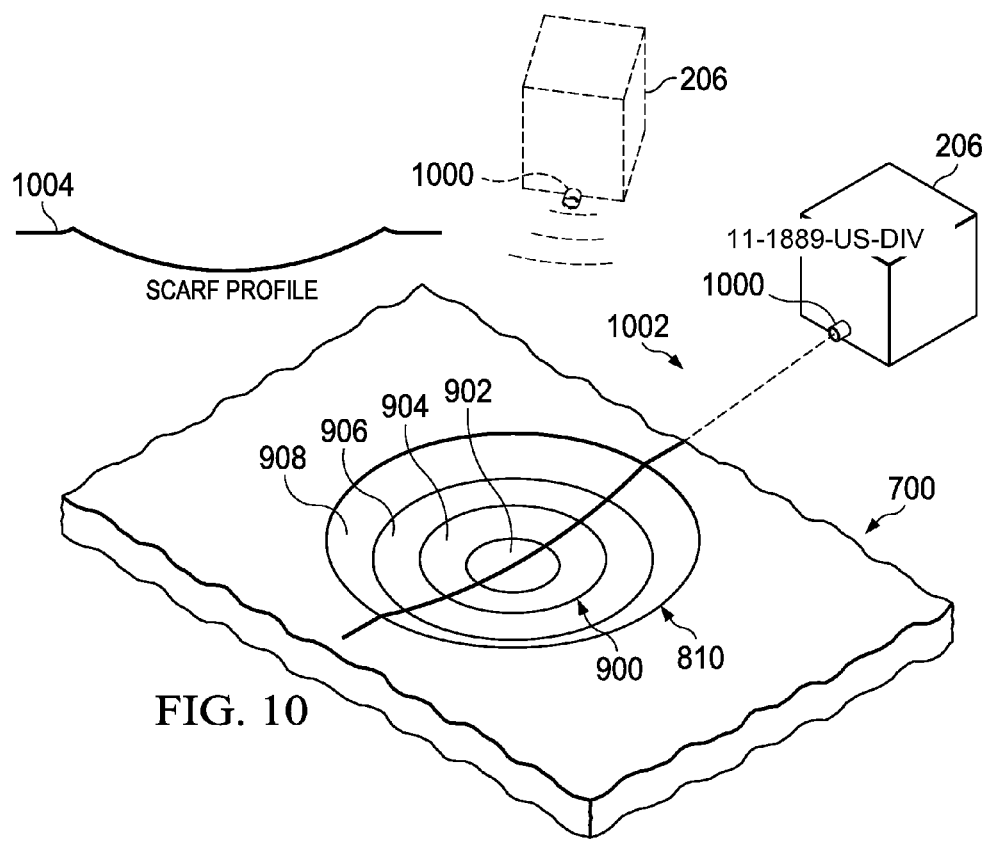
FIG. 10 is an illustration of a nondestructive evaluation system identifying a profile for a scarf in accordance with an illustrative embodiment.

With reference now to FIG. 10, an illustration of nondestructive evaluation system 206 identifying a profile for scarf 900 is depicted in accordance with an illustrative embodiment. As depicted, nondestructive evaluation system 206 may have laser device 1000 configured to generate laser beam 1002. As depicted, laser beam 1002 may be pointed across scarf 900. Laser beam 1002 may follow the contour of scarf 900 when laser beam 1002 is pointed across scarf 900.

Nondestructive evaluation system 206 may be moved such that data about scarf 900 may be generated. This data may be used to identify profile 1004 for scarf 900. Profile 1004 may then be used to determine whether scarf 900 has been formed according to a rework plan for inconsistency 702 in FIG. 7. In particular, profile 1004 may be used to determine whether scarf 900 has been formed according to a plan for scarf 900 within selected tolerances.

Figure 11:
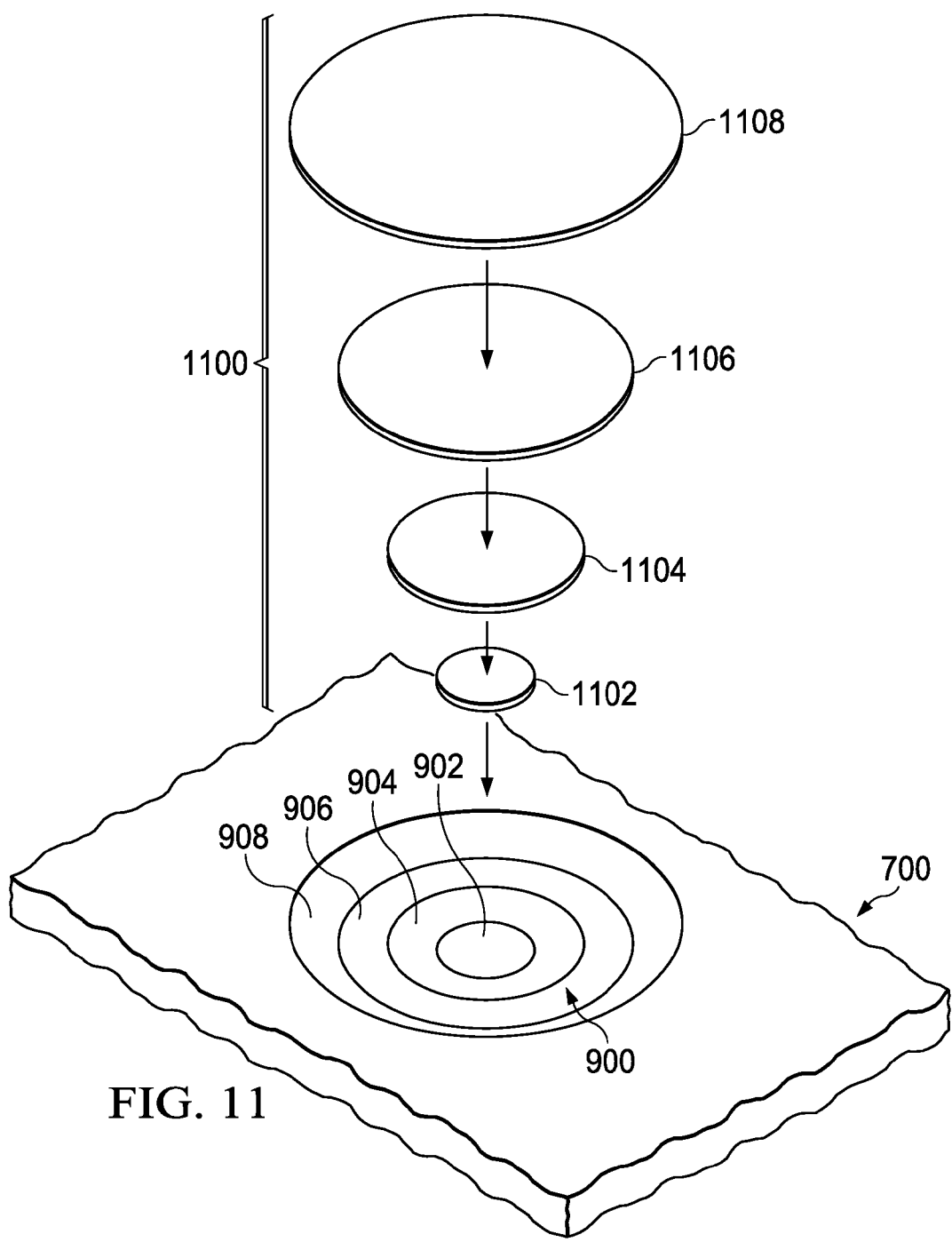
FIG. 11 is an illustration of a patch for an inconsistency in accordance with an illustrative embodiment.

Turning now to FIG. 11, an illustration of a patch for inconsistency 702 in FIG. 7 is depicted in accordance with an illustrative embodiment. In this illustrative example, patch 1100 for inconsistency 702 in FIG. 7 may be formed using patch layers 1102, 1104, 1106, and 1108. Patch layers 1102, 1104, 1106, and 1108 may be formed in a manner similar to the manner in which patch layers 520, 522, 524, and 526 are formed in FIG. 5.

Patch layers 1102, 1104, 1106, and 1108 may be applied over scarf 900 in an "inverse wedding cake" type configuration. In other words, the different patch layers may be applied over scarf 900 in order of size. In particular, the smallest patch layer, patch layer 1102, may be applied first over scarf 900. Patch layer 1104 may be applied over patch layer 1102, and patch layer 1106 may be applied over patch layer 1104. The largest patch layer, patch layer 1108, may be applied last.

Figure 12:
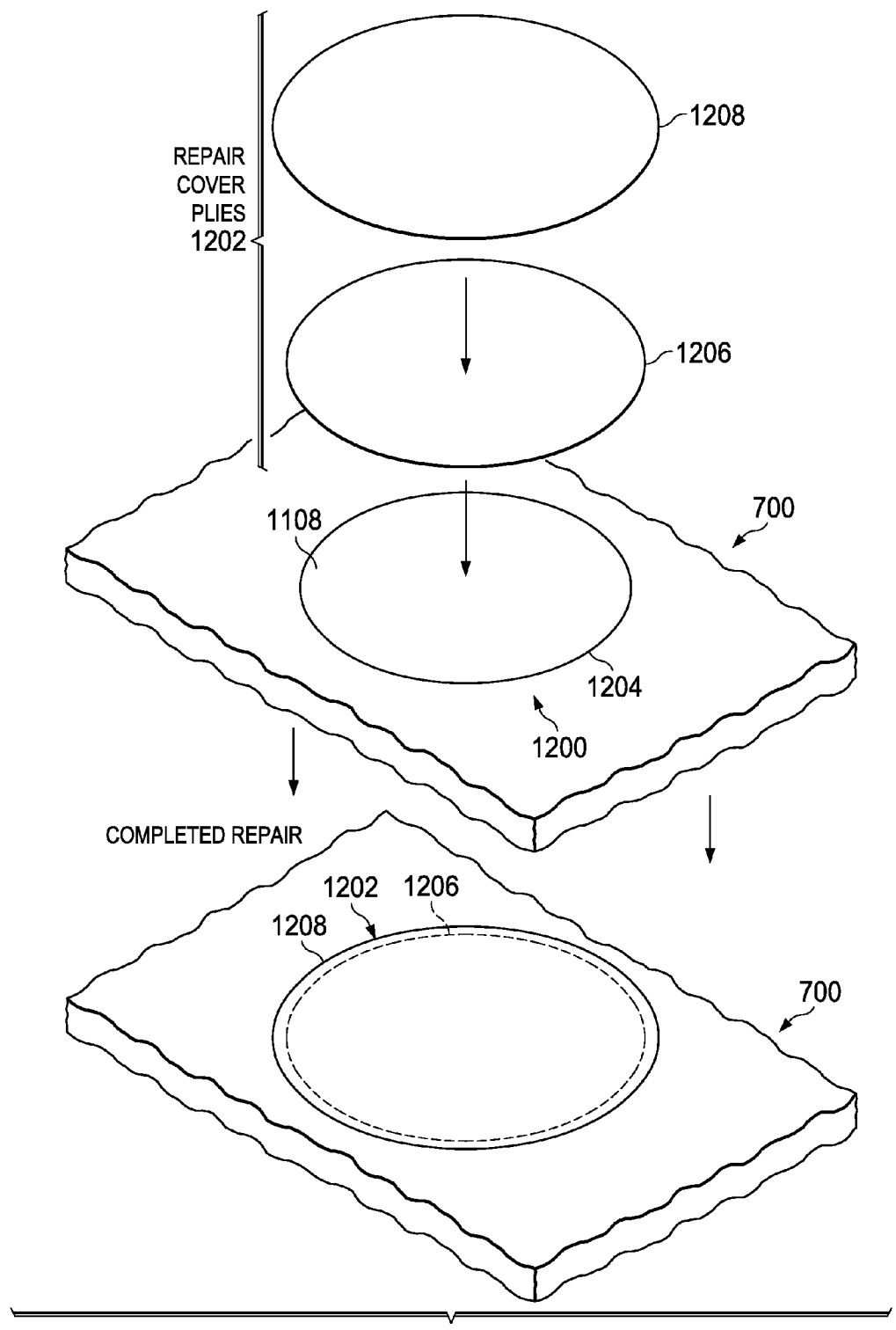
FIG. 12 is an illustration of a completed rework for an inconsistency in accordance with an illustrative embodiment.

With reference now to FIG. 12, an illustration of a completed rework for inconsistency 702 in FIG. 7 is depicted in accordance with an illustrative embodiment. In this illustrative example, the application of patch 1100 over scarf 900 in FIG. 10 has been completed. Patch layer 1108 may be substantially flush with surface 1200 of part 700 once patch 1100 has been fully applied over scarf 900.

As depicted, cover 1202 may be placed over patch 1100 to cover seam 1204 between part 700 and patch 1100. In this illustrative example, cover 1202 may include cover layer 1206 and cover layer 1208. Cover layer 1208 may be larger than cover layer 1206 in this example. Cover layer 1206 may be applied first over patch 1100. Cover layer 1208 may then be applied over cover layer 1206. As depicted, the application of cover 1202 over patch 1100 may complete the scarf rework for inconsistency 702 on part 700.

The illustrations of the different steps in the process for reworking inconsistency 204 on part 200 in FIGS. 2-6 and inconsistency 702 on part 700 in FIGS. 7-12 are not meant to imply physical or architectural limitations to the manner in which an illustrative embodiment may be implemented. Other components in addition to or in place of the ones illustrated may be used.

With reference now to FIG. 13, an illustration of a process for reworking an inconsistency in the form of a flowchart is depicted in accordance with an illustrative embodiment. The process illustrated in FIG. 13 may be implemented within, for example, without limitation, rework environment 100 in FIGS. 1A and 1B. In particular, this process may be performed using, for example, without limitation, rework system 110 in FIG. 1A, to rework inconsistency 102 on part 104 in FIG. 1B.

The process may begin by generating data 120 for part 104 using nondestructive evaluation system 118 (operation 1300). In one illustrative example, nondestructive evaluation system 118 may be an ultrasonic imaging system. The process may then identify image data 124 for inconsistency 102 on part 104 using data 120 generated by nondestructive evaluation system 118 (operation 1302). Image data 124 may include, for example, without limitation, inconsistency image 126 and part image 128.

In some illustrative examples, image data 124 may be included in data 120 received from nondestructive evaluation system 118. In other illustrative examples, rework manager 114 in rework system 110 may be configured to process data 120 to generate image data 124.

Thereafter, the process may identify information 130 about inconsistency 102 on part 104 using image data 124 (operation 1304). Information 130 may include, for example, without limitation, a number of dimensions for the size of inconsistency 102. The process may then generate rework image data 136 for use in reworking inconsistency 102 based on information 130 in which rework image data 136 includes number of patch images 140 (operation 1306). Number of patch images 140 may include one or more patch images 140. In some illustrative examples, rework image data 136 also may include number of hole images 143.

The process may then project number of patch images 140 onto rework material 144 as number of patch projections 149 using projection system 116 (operation 1308). Then, number of patch layers 148 may be cut from rework material 144 using number of patch projections 149 on rework material 144 (operation 1310). Operation 1310 may be performed using rework tool 150. Thereafter, number of patch layers 148 may be applied over inconsistency 102 on part 104 to form patch 142 for inconsistency 102 (operation 1312), with the process terminating thereafter.

With reference now to FIG. 14, an illustration of a process for preventing an inconsistency on a part from increasing in size in the form of a flowchart is depicted in accordance with an illustrative example. The process illustrated in FIG. 14 may be implemented within, for example, without limitation, rework environment 100 in FIGS. 1A and 1B. In particular, this process may be performed using, for example, without limitation, rework system 110 in FIG. 1A, to rework inconsistency 102 on part 104 in FIG. 1B.

Further, this process may be performed during the process described in FIG. 13. For example, without limitation, this process may be performed after operation 1306 but before operation 1312 in FIG. 13.

The process may begin by projecting number of hole images 143 in rework image data 136 onto part 104 as number of hole projections 147 around inconsistency 102 on part 104 (operation 1400). Thereafter, the process may drill number of holes 154 in part 104 around inconsistency 102 using number of hole projections 147 of number of hole images 143 on part 104 (operation 1402), with the process terminating thereafter. Operation 1402 may be performed using, for example, without limitation, drilling tool 156. Number of holes 154 may be configured to prevent inconsistency 102 from expanding.

With reference now to FIG. 15, an illustration of a process for reworking an inconsistency in the form of a flowchart is depicted in accordance with an illustrative embodiment. The process illustrated in FIG. 15 may be implemented within, for example, without limitation, rework environment 100 in FIGS. 1A and 1B. In particular, this process may be performed using, for example, without limitation, rework system 110 in FIG. 1A, to rework inconsistency 102 on part 104 in FIG. 1B.

The process may begin by generating data 120 for part 104 using nondestructive evaluation system 118 (operation 1500). In one illustrative example, nondestructive evaluation system 118 may be an ultrasonic imaging system. The process may then identify image data 124 for inconsistency 102 on part 104 using data 120 generated by nondestructive evaluation system 118 (operation 1502). Image data 124 may include, for example, without limitation, inconsistency image 126 and part image 128.

In some illustrative examples, image data 124 may be included in data 120 received from nondestructive evaluation system 118. In other illustrative examples, rework manager 114 in rework system 110 may be configured to process data 120 to generate image data 124.

Thereafter, the process may identify information 130 about inconsistency 102 on part 104 using image data 124 (operation 1504). Information 130 may include, for example, without limitation, a number of dimensions for the size of inconsistency 102.

The process may then identify perimeter image 162 based on information 130 about inconsistency 102 (operation 1506). The process may then project perimeter image 162 onto part 104 as perimeter projection 166 (operation 1508). The process may then remove portion 168 of section 105 of part 104 within perimeter projection 166 on part 104 in number of layers 169 (operation 1510). In this illustrative process, portion 168 may be removed using a scarfing process to form scarf 171. However, in other illustrative examples, portion 168 of section 105 may be removed using a step-lap process or some other suitable type of process in which scarf 171 is not formed.

Thereafter, the process may identify profile 164 for section 105 of part 104 with portion 168 removed (operation 1512). Next, the process may then generate rework image data 136 using profile 164 in which rework image data 136 includes number of patch images 140 (operation 1514).

The process may then project number of patch images 140 onto rework material 144 as number of patch projections 149 using projection system 116 (operation 1516). Then, number of patch layers 148 may be formed from rework material 144 using number of patch projections 149 on rework material 144 (operation 1518). Operation 1518 may be performed using rework tool 150. Thereafter, number of patch layers 148 may be applied over section 105 of part 104 to form patch 142 (operation 1520). Cover 172 may then be applied over patch 142 to complete the rework for inconsistency 102 (operation 1522), with the process terminating thereafter.

The flowcharts and block diagrams in the different depicted embodiments illustrate the architecture, functionality, and operation of some possible implementations of apparatus and methods in an illustrative embodiment. In this regard, each block in the flowcharts or block diagrams may represent a module, segment, function, and/or a portion of an operation or step. For example, one or more of the blocks may be implemented as program code, in hardware, or a combination of the program code and hardware. When implemented in hardware, the hardware may, for example, without limitation, take the form of integrated circuits that are manufactured or configured to perform one or more operations in the flowcharts or block diagrams.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

Turning now to FIG. 16, an illustration of a data processing system is depicted in accordance with an illustrative embodiment. In this illustrative example, data processing system 1600 may be used to implement one or more computers in computer system 122 in FIG. 1A and/or computer system 300 in FIGS. 3 and 5. In this illustrative example, data processing system 1600 includes communications framework 1602, which provides communications between processor unit 1604, memory 1606, persistent storage 1608, communications unit 1610, input/output (I/O) unit 1612, and display 1614.

Processor unit 1604 serves to execute instructions for software that may be loaded into memory 1606. Processor unit 1604 may be a number of processors, a multi-processor core, or some other type of processor, depending on the particular implementation. Further, processor unit 1604 may be implemented using a number of heterogeneous processor systems in which a main processor is present with secondary processors on a single chip. As another illustrative example, processor unit 1604 may be a symmetric multi-processor system containing multiple processors of the same type.

Memory 1606 and persistent storage 1608 are examples of storage devices 1616. A storage device is any piece of hardware that is capable of storing information such as, for example, without limitation, data, program code in functional form, and/or other suitable information either on a temporary basis and/or a permanent basis. Storage devices 1616 also may be referred to as computer readable storage devices in these examples. Memory 1606, in these examples, may be, for example, a random access memory or any other suitable volatile or non-volatile storage device. Persistent storage 1608 may take various forms, depending on the particular implementation.

For example, without limitation, persistent storage 1608 may contain one or more components or devices. For example, persistent storage 1608 may be a hard drive, a flash memory, a rewritable optical disk, a rewritable magnetic tape, or some combination of the above. The media used by persistent storage 1608 also may be removable. For example, a removable hard drive may be used for persistent storage 1608.

Communications unit 1610, in these examples, provides for communications with other data processing systems or devices. In these examples, communications unit 1610 is a network interface card. Communications unit 1610 may provide communications through the use of either or both physical and wireless communications links.

Input/output unit 1612 allows for input and output of data with other devices that may be connected to data processing system 1600. For example, input/output unit 1612 may provide a connection for user input through a keyboard, a mouse, and/or some other suitable input device. Further, input/output unit 1612 may send output to a printer. Display 1614 provides a mechanism to display information to a user.

Instructions for the operating system, applications, and/or programs may be located in storage devices 1616, which are in communication with processor unit 1604 through communications framework 1602. In these illustrative examples, the instructions are in a functional form on persistent storage 1608. These instructions may be loaded into memory 1606 for execution by processor unit 1604. The processes of the different embodiments may be performed by processor unit 1604 using computer-implemented instructions, which may be located in a memory, such as memory 1606.

These instructions are referred to as program code, computer usable program code, or computer readable program code that may be read and executed by a processor in processor unit 1604. The program code in the different embodiments may be embodied on different physical or computer readable storage media, such as memory 1606 or persistent storage 1608.

Program code 1618 is located in a functional form on computer readable media 1620 that is selectively removable and may be loaded onto or transferred to data processing system 1600 for execution by processor unit 1604. Program code 1618 and computer readable media 1620 form computer program product 1622 in these examples. In one example, computer readable media 1620 may be computer readable storage media 1624 or computer readable signal media 1626.

Computer readable storage media 1624 may include, for example, without limitation, an optical or magnetic disk that is inserted or placed into a drive or other device that is part of persistent storage 1608 for transfer onto a storage device, such as a hard drive, that is part of persistent storage 1608. Computer readable storage media 1624 also may take the form of a persistent storage, such as a hard drive, a thumb drive, or a flash memory, that is connected to data processing system 1600. In some instances, computer readable storage media 1624 may not be removable from data processing system 1600.

In these examples, computer readable storage media 1624 is a physical or tangible storage device used to store program code 1618 rather than a medium that propagates or transmits program code 1618. Computer readable storage media 1624 is also referred to as a computer readable tangible storage device or a computer readable physical storage device. In other words, computer readable storage media 1624 is a media that can be touched by a person.

Alternatively, program code 1618 may be transferred to data processing system 1600 using computer readable signal media 1626. Computer readable signal media 1626 may be, for example, without limitation, a propagated data signal containing program code 1618. For example, computer readable signal media 1626 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 1618 may be downloaded over a network to persistent storage 1608 from another device or data processing system through computer readable signal media 1626 for use within data processing system 1600. For instance, program code stored in a computer readable storage medium in a server data processing system may be downloaded over a network from the server to data processing system 1600. The data processing system providing program code 1618 may be a server computer, a client computer, or some other device capable of storing and transmitting program code 1618.

The different components illustrated for data processing system 1600 are not meant to provide architectural limitations to the manner in which different embodiments may be implemented. The different illustrative embodiments may be implemented in a data processing system including components in addition to or in place of those illustrated for data processing system 1600. Other components shown in FIG. 16 can be varied from the illustrative examples shown. The different embodiments may be implemented using any hardware device or system capable of running program code. As one example, the data processing system may include organic components integrated with inorganic components and/or may be comprised entirely of organic components excluding a human being. For example, a storage device may be comprised of an organic semiconductor.

In another illustrative example, processor unit 1604 may take the form of a hardware unit that has circuits that are manufactured or configured for a particular use. This type of hardware may perform operations without needing program code to be loaded into a memory from a storage device to be configured to perform the operations.

For example, when processor unit 1604 takes the form of a hardware unit, processor unit 1604 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, without limitation, a programmable logic array, a field programmable logic array, a field programmable gate array, and other suitable hardware devices. With this type of implementation, program code 1618 may be omitted, because the processes for the different embodiments are implemented in a hardware unit.

In still another illustrative example, processor unit 1604 may be implemented using a combination of processors found in computers and hardware units. Processor unit 1604 may have a number of hardware units and a number of processors that are configured to run program code 1618. With this depicted example, some of the processes may be implemented in the number of hardware units, while other processes may be implemented in the number of processors.

In another example, a bus system may be used to implement communications framework 1602 and may be comprised of one or more buses, such as a system bus or an input/output bus. Of course, the bus system may be implemented using any suitable type of architecture that provides for a transfer of data between different components or devices attached to the bus system.

Additionally, a communications unit may include a number of devices that transmit data, receive data, or transmit and receive data. A communications unit may be, for example, a modem or a network adapter, two network adapters, or some combination thereof. Further, a memory may be, for example, without limitation, memory 1606 or a cache, such as found in an interface and memory controller hub that may be present in communications framework 1602.

Figure 17:
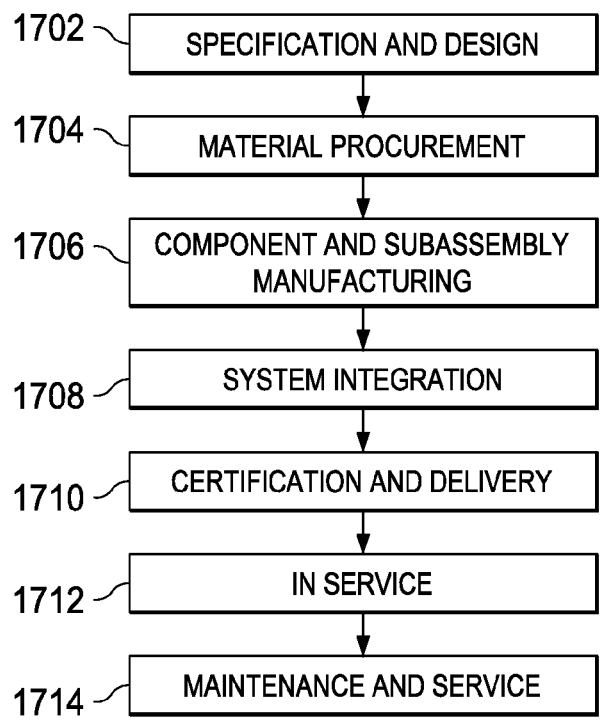
FIG. 17 is an illustration of an aircraft manufacturing and service method in accordance with an illustrative embodiment.
Figure 18:
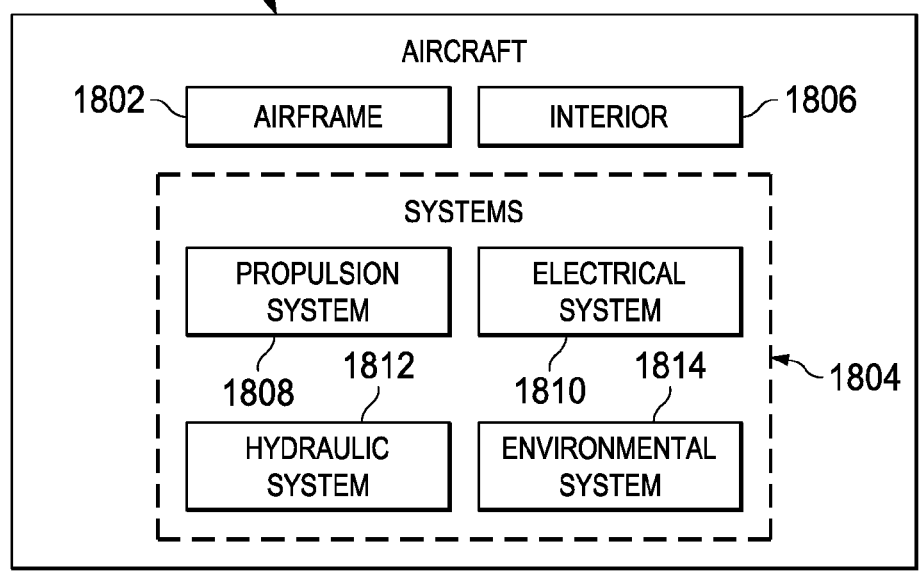
FIG. 18 is an illustration of an aircraft in accordance with an illustrative embodiment.

Illustrative embodiments of the disclosure may be described in the context of aircraft manufacturing and service method 1700 as shown in FIG. 17 and aircraft 1800 as shown in FIG. 18. Turning first to FIG. 17, an illustration of an aircraft manufacturing and service method is depicted in accordance with an illustrative embodiment. During preproduction, aircraft manufacturing and service method 1700 may include specification and design 1702 of aircraft 1800 in FIG. 18 and material procurement 1704.

During production, component and subassembly manufacturing 1706 and system integration 1708 of aircraft 1800 in FIG. 18 takes place. Thereafter, aircraft 1800 in FIG. 18 may go through certification and delivery 1710 in order to be placed in service 1712. While in service 1712 by a customer, aircraft 1800 in FIG. 18 is scheduled for routine maintenance and service 1714, which may include modification, reconfiguration, refurbishment, and other maintenance or service.

Each of the processes of aircraft manufacturing and service method 1700 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 18, an illustration of an aircraft is depicted in which an illustrative embodiment may be implemented. In this example, aircraft 1800 is produced by aircraft manufacturing and service method 1700 in FIG. 17 and may include airframe 1802 with plurality of systems 1804 and interior 1806. Examples of systems 1804 include one or more of propulsion system 1808, electrical system 1810, hydraulic system 1812, and environmental system 1814. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 1700 in FIG. 17. In one illustrative example, components or subassemblies produced in component and subassembly manufacturing 1706 in FIG. 17 may be fabricated or manufactured in a manner similar to components or subassemblies produced while aircraft 1800 is in service 1712 in FIG. 17.

As yet another example, one or more apparatus embodiments, method embodiments, or a combination thereof may be utilized during production stages, such as component and subassembly manufacturing 1706 and system integration 1708 in FIG. 17. One or more apparatus embodiments, method embodiments, or a combination thereof may be utilized while aircraft 1800 is in service 1712 and/or during maintenance and service 1714 in FIG. 17.

For example, without limitation, rework of an inconsistency on a part in aircraft 1800 using rework system 180 in FIG. 1A may be performed during at least one of material procurement 1704, component and subassembly manufacturing 1706, system integration 1708, maintenance and service 1714, and some other stage in aircraft manufacturing and service method 1700 in FIG. 17. The use of a number of the different illustrative embodiments may substantially expedite the assembly and maintenance of and/or reduce the cost of aircraft 1800.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for reworking an inconsistency on a part, the method comprising:

identifying information about the inconsistency on the part using data generated by a nondestructive evaluation system;

removing a portion of a section of the part in which the inconsistency is located based on the information about the inconsistency;

identifying a profile for the section of the part;

generating rework image data using the profile in which the rework image data comprises a number of patch images and a number of hole images;

projecting the number of hole images onto the part as a number of hole projections around the inconsistency;

forming a number of holes in the part using the number of hole projections of the number of hole images on the part around the inconsistency, wherein the number of holes is configured to prevent the inconsistency from increasing in size; and projecting the number of patch images onto a rework material as a number of patch projections for use in forming a patch to be applied over the section of the part and the number of holes in the part.

2. The method of claim 1 further comprising:

forming a number of patch layers from the rework material using the number of patch projections of the number of patch images on the rework material.

3. The method of claim 2, wherein the step of forming the number of patch layers from the rework material using the number of patch projections of the number of patch images on the rework material comprises:

cutting the number of patch layers out of the rework material using the number of patch projections of the number of patch images on the rework material.

4. The method of claim 2 further comprising:

applying the number of patch layers over the section of the part having the portion removed to form the patch.

5. The method of claim 4 further comprising:

applying a cover over the patch.

6. The method of claim 1, wherein the step of removing the portion of the section of the part comprises:

removing the portion of the section of the part in which the inconsistency is located to form a scarf based on the information about the inconsistency.

7. The method of claim 6, wherein the step of identifying the profile for the section of the part comprises:

pointing a laser beam across the scarf using a laser device; and identifying the profile for the scarf using the laser beam.

8. The method of claim 1, wherein the step of removing the portion of the section of the part comprises:

identifying a perimeter image based on the information about the inconsistency;

projecting the perimeter image onto the part as a perimeter projection; and removing the portion of the section of the part within the perimeter projection on the part to form a scarf using a scarfing tool, wherein the scarf is formed in a number of layers.

9. The method of claim 1, wherein the step of identifying the information about the inconsistency using the data generated by the nondestructive evaluation system comprises:

identifying image data for the inconsistency on the part using the data for the part generated by the nondestructive evaluation system; and identifying at least one of a size, a shape, a width, a length, a depth, a height, or a classification for the inconsistency using the image data.

10. The method of claim 9, wherein the step of identifying the image data for the inconsistency on the part using the data for the part generated by the nondestructive evaluation system comprises:
  receiving the data generated by the nondestructive evaluation system; and
  processing the data received from the nondestructive evaluation system to identify the image data for the inconsistency on the part, wherein the image data includes at least one of an inconsistency image or a part image.

11. The method of claim 1 further comprising:
  generating the data for the part using the nondestructive evaluation system, wherein the data comprises the image data in which the image data includes at least one of an inconsistency image and a part image and wherein the nondestructive evaluation system is selected from one of an ultrasonic system, an eddy current testing system, an x-ray system, a magnetic resonance system, an interferometry system, an imaging system, a thermoelectric system, a thermographic system, or a microwave-based system.

12. The method of claim 1, wherein the information about the inconsistency comprises at least one of a size, a shape, a width, a length, a depth, a height, or a classification for the inconsistency; the method further comprising:
  generating the data for the part using the nondestructive evaluation system in which the nondestructive evaluation system is selected from one of an ultrasonic system, an eddy current testing system, an x-ray system, a magnetic resonance system, an interferometry system, an imaging system, a thermoelectric system, a thermographic system, or a microwave-based system;
  identifying image data for the inconsistency on the part using the data for the part generated by the nondestructive evaluation system;
  identifying a perimeter image for use in forming a scarf based on the information about the inconsistency;
  projecting the perimeter image onto the part as a perimeter projection;
  removing a portion of the part within the perimeter projection on the part to form the scarf in a number of layers;
  pointing a laser beam across the scarf using a laser device;
  identifying a profile for the scarf using the laser beam;
  generating the rework image data using the profile in which the rework image data comprises the number of patch images;
  forming a number of patch layers from the rework material using the number of patch projections of the number of patch images on the rework material;
  applying the number of patch layers over the scarf to form the patch; and
  applying a cover over the patch.

13. An apparatus comprising:
  a rework manager configured to:
    identify information about an inconsistency on a part using data generated by a nondestructive evaluation system in which a portion of a section of the part in which the inconsistency is located is removed based on the information about the inconsistency;
    identify a profile for the section of the part;
    generate rework image data using the profile in which the rework image data comprises a number of patch images and a number of hole images;
  a projection system configured to:
    project the number of hole images onto the part as a number of hole projections around the inconsistency, wherein the number of holes is configured to prevent the inconsistency from increasing in size; and
    project the number of patch images onto a rework material as a number of patch projections for use in forming a patch to be applied over the section of the part and the number of holes in the part; and
  a drilling tool configured to form the number of holes in the part using the number of hole projections of the number of hole images.

14. The apparatus of claim 13 further comprising:
  a rework tool configured to form a number of patch layers from the rework material using the number of patch projections of the number of patch images on the rework material in which the number of patch layers is applied over the section to form the patch.

15. The apparatus of claim 14 further comprising:
  a cover configured to be applied over the patch.

16. The apparatus of claim 13, wherein the rework manager is further configured to generate a perimeter image based on the information about the inconsistency and wherein the projection system is further configured to project the perimeter image onto the part as a perimeter projection.

17. The apparatus of claim 16, further comprising:
  a scarfing tool configured to remove the portion of the section of the part within the perimeter projection to form a scarf in a number of layers.

18. The apparatus of claim 13, wherein the information about the inconsistency comprises at least one of a size, a shape, a width, a length, a depth, a height, or a classification for the inconsistency.

19. The apparatus of claim 13, wherein the portion of the section of the part is removed using at least one of a scarfing process or a step-lap process.

20. The apparatus of claim 13, wherein:
  the nondestructive evaluation system is selected from one of an ultrasonic system, an eddy current testing system, an x-ray system, a magnetic resonance system, an interferometry system, an imaging system, a thermoelectric system, a thermographic system, or a microwave-based system;
  the rework manager is configured to identify information about the inconsistency on the part using the data generated by the nondestructive evaluation system in which the information about the inconsistency comprises at least one of a size, a shape, a width, a length, a depth, a height, and a classification for the inconsistency; and generate a perimeter image for use in forming a scarf in the part based on the information about the inconsistency;
  the projection system is configured to project the perimeter image onto the part as a perimeter projection for use in forming the scarf and project the number of patch images onto the rework material as the number of patch projections for use in forming the patch to be applied over the scarf;
  wherein the apparatus further comprises:
  a scarfing tool configured to remove a portion of the part within the perimeter projection to form the scarf in a number of layers;
  a rework tool configured to form a number of patch layers from the rework material using the number of patch projections of the number of patch images on the rework material in which the number of patch layers is applied over the scarf to form the patch; and
  a cover configured to be applied over the patch.

* * * * *